(12) United States Patent
Bui et al.

(10) Patent No.: US 8,035,183 B2
(45) Date of Patent: Oct. 11, 2011

(54) PHOTODIODES WITH PN JUNCTION ON BOTH FRONT AND BACK SIDES

(75) Inventors: Peter Steven Bui, Cerritos, CA (US); Narayan Dass Taneja, Long Beach, CA (US); Manoocher Mansouri Aliabadi, Studio City, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 0 days.

(21) Appl. No.: 12/722,685

(22) Filed: Mar. 12, 2010

(65) Prior Publication Data

US 2010/0264505 A1 Oct. 21, 2010

Related U.S. Application Data

(63) Continuation-in-part of application No. 12/505,610, filed on Jul. 20, 2009, now abandoned, which is a continuation of application No. 11/401,099, filed on Apr. 10, 2006, now Pat. No. 7,579,666, which is a continuation of application No. 10/797,324, filed on Mar. 10, 2004, now Pat. No. 7,057,254, application No. 12/722,685, which is a continuation-in-part of application No. 11/081,366, filed on Mar. 16, 2005, now Pat. No. 7,880,258, and a continuation-in-part of application No. 12/325,304, filed on Dec. 1, 2008, now Pat. No. 7,898,055, which is a continuation of application No. 11/774,002, filed on Jul. 6, 2007, now Pat. No. 7,470,966, application No. 12/722,685, which is a continuation-in-part of application No. 11/849,623, filed on Sep. 4, 2007, now Pat. No. 7,728,367, which is a continuation of application No. 11/383,485, filed on May 15, 2006, now Pat. No. 7,279,731, application No. 12/722,685, which is a continuation-in-part of application No. 12/499,203, filed on Jul. 8, 2009, which is a continuation of application No. 11/258,848, filed on Oct. 25, 2005, now Pat. No. 7,576,369, application No. 12/722,685, which is a continuation-in-part of application No. 12/637,529, filed on Dec. 14, 2009, which is a continuation of application No. 11/555,367, filed on Nov. 1, 2006, now Pat. No. 7,656,001, application No. 12/722,685, which is a continuation-in-part of application No. 12/637,557, filed on Dec. 14, 2009, now Pat. No. 7,968,964, which is a continuation-in-part of application No. 11/532,191, filed on Sep. 15, 2006, now Pat. No. 7,655,999, application No. 12/722,685, which is a continuation-in-part of application No. 11/422,246, filed on Jun. 5, 2006, and a continuation-in-part of application No. 12/559,498, filed on Sep. 15, 2009, which is a continuation-in-part of application No. 11/744,908, filed on May 7, 2007, application No. 12/722,685, which is a continuation-in-part of application No. 12/709,621, filed on Feb. 22, 2010, and a continuation-in-part of application No. 12/199,558, filed on Aug. 27, 2008, now Pat. No. 7,709,921, and a continuation-in-part of application No. 12/689,349, filed on Jan. 19, 2010.

(60) Provisional application No. 60/468,181, filed on May 5, 2003, provisional application No. 61/096,877, filed on Sep. 15, 2008, provisional application No. 61/099,768, filed on Sep. 24, 2008, provisional application No. 61/159,732, filed on Mar. 12, 2009.

(51) Int. Cl.
*H01L 31/00* (2006.01)

(52) U.S. Cl. ............................. 257/440; 257/E31.001

(58) Field of Classification Search .................. 257/414, 257/428, 431, 443, 444, E31.001, 440
See application file for complete search history.

(56) References Cited

U.S. PATENT DOCUMENTS

| | | |
|---|---|---|
| 3,041,226 A | 6/1962 | Pennington |
| 3,713,921 A | 1/1973 | Fleischer et al. |
| 3,765,969 A | 10/1973 | Kragness et al. |
| 3,801,390 A | 4/1974 | Lepselter et al. |
| 3,808,068 A | 4/1974 | Johnson et al. |

| | | |
|---|---|---|
| 3,887,936 A | 6/1975 | Shannon et al. |
| 4,210,923 A | 7/1980 | North et al. |
| 4,290,844 A | 9/1981 | Rotolante et al. |
| 4,329,702 A * | 5/1982 | Wallace .................. 257/431 |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,049,962 A | 9/1991 | Huang et al. |
| 5,053,318 A | 10/1991 | Gulla et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,254,480 A | 10/1993 | Tran |
| 5,276,955 A | 1/1994 | Noddin et al. |
| 5,408,122 A | 4/1995 | Reele |
| 5,430,321 A | 7/1995 | Effelsberg |
| 5,446,308 A | 8/1995 | Piccone et al. |
| 5,446,751 A | 8/1995 | Wake |
| 5,457,322 A * | 10/1995 | Kitaguchi et al. ....... 250/370.06 |
| 5,501,990 A | 3/1996 | Holm et al. |
| 5,576,559 A | 11/1996 | Davis |
| 5,599,389 A | 2/1997 | Iwasaki |
| 5,656,508 A | 8/1997 | So et al. |
| 5,818,096 A | 10/1998 | Ishibashi et al. |
| 5,825,047 A | 10/1998 | Ajisawa et al. |
| 5,869,834 A | 2/1999 | Wipenmyr |
| 5,889,313 A | 3/1999 | Parker |
| 5,923,720 A | 7/1999 | Barton et al. |
| 5,928,438 A | 7/1999 | Salami et al. |
| 6,027,956 A | 2/2000 | Irissou |
| 6,175,141 B1 | 1/2001 | Hofbauer et al. |
| 6,218,684 B1 | 4/2001 | Kuhara et al. |
| 6,326,300 B1 | 12/2001 | Liu et al. |
| 6,326,649 B1 | 12/2001 | Chang et al. |
| 6,352,517 B1 | 3/2002 | Flock et al. |
| 6,426,991 B1 | 7/2002 | Mattson et al. |
| 6,438,296 B1 | 8/2002 | Kongable |
| 6,489,635 B1 | 12/2002 | Sugg |
| 6,504,158 B2 | 1/2003 | Possin |
| 6,510,195 B1 | 1/2003 | Chappo et al. |
| 6,546,171 B2 | 4/2003 | Fukutomi |
| 6,569,700 B2 | 5/2003 | Yang |
| 6,593,636 B1 | 7/2003 | Bui et al. |
| 6,670,258 B2 | 12/2003 | Carlson et al. |
| 6,734,416 B2 | 5/2004 | Carlson et al. |
| 6,772,729 B2 | 8/2004 | Brosseau et al. |
| 6,815,790 B2 | 11/2004 | Bui et al. |
| 6,826,080 B2 | 11/2004 | Park et al. |
| 7,057,254 B2 | 6/2006 | Bui et al. |
| 7,112,465 B2 | 9/2006 | Goushcha et al. |
| 7,198,972 B2 | 4/2007 | Sato |
| 7,242,069 B2 | 7/2007 | Bui et al. |
| 7,279,731 B1 | 10/2007 | Bui et al. |
| 2001/0034105 A1 | 10/2001 | Carlson |
| 2002/0056845 A1 | 5/2002 | Iguchi et al. |
| 2004/0104351 A1 | 6/2004 | Shibayama |
| 2004/0206886 A1 | 10/2004 | Carlson et al. |
| 2004/0222358 A1 | 11/2004 | Bui et al. |
| 2004/0241897 A1 | 12/2004 | Rhee et al. |
| 2004/0262652 A1 | 12/2004 | Goushcha et al. |
| 2005/0186754 A1 | 8/2005 | Kim |
| 2006/0220078 A1 | 10/2006 | Bui et al. |
| 2006/0255420 A1 | 11/2006 | Bui et al. |
| 2006/0278898 A1 | 12/2006 | Shibayama |
| 2007/0090394 A1 | 4/2007 | Bui et al. |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0099871 A1 | 5/2008 | Bui et al. |
| 2008/0128846 A1 | 6/2008 | Bui et al. |
| 2008/0277753 A1 | 11/2008 | Bui et al. |

FOREIGN PATENT DOCUMENTS

| | | |
|---|---|---|
| EP | 0 347 157 | 12/1989 |
| EP | 0436282 | 7/1991 |
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Y. Akatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

\* cited by examiner

*Primary Examiner* — Ha Tran T Nguyen

*Assistant Examiner* — Kevin Quinto

(74) *Attorney, Agent, or Firm* — Novel IP

(57) ABSTRACT

The present invention is directed toward a dual junction photodiode semiconductor device. The photodiode has a semiconductor substrate of a first conductivity type, a first impurity region of a second conductivity type shallowly diffused on the front side of the semiconductor substrate, a second impurity region of the second conductivity type shallowly diffused on the back side of the semiconductor substrate, a first PN junction formed between the first impurity region and the semiconductor substrate, and a second PN junction formed between the second impurity region and the semiconductor substrate. Since light beams of a shorter wavelength are absorbed near the surface of a semiconductor, while light beams of a longer wavelength reach deeper sections, the two PN junctions at front and back sides of the photodiode allow the device to be used as an adjustable low pass or high pass wavelength filter detector.

20 Claims, 30 Drawing Sheets

PHOTODIODES WITH PN JUNCTION ON BOTH FRONT AND BACK SIDES

CROSS REFERENCE

The present invention is a continuation-in-part of U.S. patent application Ser. No. 12/505,610, which was filed on Jul. 20, 2009, now abandoned which is a continuation of U.S. patent application Ser. No. 11/401,099, which was filed on Apr. 10, 2006 and issued as U.S. Pat. No. 7,579,666, which is a continuation of U.S. patent Ser. No. 10/797,324, filed on Mar. 10, 2004 now U.S. Pat. No. 7,057,254 which relies on, for priority, U.S. Provisional Application No. 60/468,181, having a priority date of May 5, 2003.

The present invention is also a continuation-in-part of U.S. patent application Ser. No. 11/081,366, which was filed on Mar. 16, 2005, now U.S. Pat. No. 7,880,258 which relies on, for priority, U.S. patent application Ser. No. 10/838,897, having a filing date of May 5, 2004, now abandoned which further relies on Provisional Application No. 60/468,181, having a priority date of May 5, 2003.

The present invention is also a continuation-in-part of U.S. patent application Ser. No. 12/325,304, filed on Dec. 1, 2008, now U.S. Pat. No. 7,898,055 which is a continuation of U.S. patent application Ser. No. 11/774,002, which was filed on Jul. 6, 2007 and issued as U.S. Pat. No. 7,470,966, which is a continuation of U.S. patent application Ser. No. 11/081,219, which was filed on Mar. 16, 2005 and issued as U.S. Pat. No. 7,256,470.

The present invention is also a continuation-in-part of U.S. patent application Ser. No. 11/849,623, filed on Sep. 4, 2007, now U.S. Pat. No. 7,728,367 which is a continuation of U.S. patent application Ser. No. 11/383,485, which was filed on May 15, 2006 and issued as U.S. Pat. No. 7,279,731.

The present invention is also a continuation-in-part of U.S. patent application Ser. No. 12/499,203, filed on Jul. 8, 2009, which is a continuation of U.S. patent application Ser. No. 11/258,848, which was filed on Oct. 25, 2005 and issued as U.S. Pat. No. 7,576,369.

The present invention is also a continuation-in-part of U.S. patent application Ser. No. 12/637,529, filed on Dec. 14, 2009, which is a continuation of U.S. patent application Ser. No. 11/555,367, which was filed on Nov. 1, 2006 and issued as U.S. Pat. No. 7,656,001.

The present invention is also a continuation-in-part of U.S. patent application Ser. No. 12/637,557, filed on Dec. 14, 2009, which is a continuation of U.S. patent application Ser. No. 11/532,191, which was filed on Sep. 15, 2006 and issued as U.S. Pat. No. 7,655,999.

The present invention is also a continuation-in-part of U.S. patent application Ser. No. 11/422,246, filed on Jun. 5, 2006.

The present invention is also a continuation-in-part of U.S. patent application Ser. No. 12/559,498, filed on Sep. 15, 2009, which is a continuation-in-part of U.S. patent application Ser. No. 11/744,908, filed on May 7, 2007 and which relies on U.S. Provisional Application No. 61/159,732 (filed on Mar. 12, 2009), 61/099,768 (filed on Sep. 24, 2008), and 61/096,877 (filed on Sep. 15, 2008).

The present invention is also a continuation-in-part of U.S. patent application Ser. No. 12/709,621, which was filed on Feb. 22, 2010.

The present invention is also a continuation-in-part of U.S. patent application Ser. No. 12/199,558, which was filed on Aug. 27, 2008 now U.S. Pat. No. 7,709,921

The present invention is also a continuation-in-part of U.S. patent application Ser. No. 12/689,349, which was filed on Jan. 19, 2010.

All of the aforementioned applications and issued patents are herein incorporated by reference in their entirety.

FIELD OF THE INVENTION

The present invention relates generally to the field of wavelength sensitive photodiodes and more specifically to photodiodes with PN junctions on both front and back sides.

BACKGROUND OF THE INVENTION

Photodiodes comprise of multiple radiation sensitive junctions formed in semiconductor material. Within a photodiode, charge carriers are created by light that illuminates the junction and photocurrent is generated dependent upon the degree of illumination. Similarly, a photodiode array comprises of large numbers of light sensitive spaced-apart elements, further comprising of a semiconductor junction and a region of high response where the photo-generated charge carriers are collected. Arrays of photodiodes or basically photodiodes are used in various applications including, but not limited to, optical position encoding, and low light-level imaging, such as night photography, nuclear medical imaging, photon medical imaging, multi-slice computer tomography (CT) imaging, radiation detection and ballistic photon detection.

Photodiodes are characterized by certain characteristics, such as electrical, optical, current (I), voltage (V), and noise. Electrical characteristics of photodiode dominantly include shunt resistance, series resistance, junction capacitance, rise or fall time and frequency response. Noise in photodiodes is generated by a plurality of sources including, but not limited to, thermal noise, quantum or photon noise, and flicker noise. Also, silicon photodiodes, essentially active solid-state semiconductor devices, are among the most popular photodetectors coalescing high performance over a wide wavelength range with unmatched user-friendliness. For example, silicon photodiodes are sensitive to light in the wide spectral range, extending from deep ultraviolet all the way through visible to near infrared. Additionally, silicon photodiodes detect the presence or absence of minute light intensities thereby facilitating extremely precise measurement of the same on appropriate calibration. For instance, appropriately calibrated silicon photodiodes detect and measure light intensities varying over a wide range, from very minute light intensities of below 10-13 watts/cm$^2$ to high intensities above 10-3 watts/cm$^2$.

Accordingly, there is need in the prior art for a photodiode that can be used as an adjustable low pass or high pass wavelength filter detector. Specifically, there is need in the prior art for a front and back side PN-junction photodiode that is sensitive to wavelengths and can also be used as a high speed long wavelength detector at relatively low reverse bias.

SUMMARY OF THE INVENTION

The present application discloses a dual junction photodiode semiconductor device comprising: a semiconductor substrate of a first conductivity type; a first impurity region of a second conductivity type shallowly diffused on a first side of said semiconductor substrate; a second impurity region of the second conductivity type shallowly diffused on a second side of said semiconductor substrate, said second side being opposite to said first side; a first PN junction formed between said semiconductor substrate and first impurity region; and a second PN junction formed between said semiconductor substrate and said second impurity region. The first and second PN junctions are formed at a first depth and a second depth from a top surface of said semiconductor substrate, wherein the second depth is deeper than the first depth. The semiconductor substrate has a resistivity in a range of 2000 to 6000 ohm-cm, and more particularly 4000 ohm-cm, and a thickness of in a range of 100 to 800 microns, and more particularly 400 microns.

The dual junction photodiode semiconductor device further comprises a first output electrode connected to said first impurity region; a second output electrode connected to said second impurity region; and a third output electrode connected to said semiconductor substrate, wherein said first and third output electrodes are output electrodes of the first PN junction, and said second and third output electrodes are output electrodes of the second PN junction. The first conductivity type is p+ and said second conductivity type is n+. In another embodiment, the first conductivity type is n+ and the second conductivity type is p+. The dual junction photodiode semiconductor device further comprises an anti-reflective layer on said first side, which is about 100 to 3000 Angstroms, and more particularly 1000 Angstroms, thick.

In another embodiment, the present application discloses a multi junction photodiode semiconductor device comprising a semiconductor substrate of a first conductivity type; a first impurity region of a second conductivity type shallowly diffused on a first side of said semiconductor substrate, wherein an interface between said first impurity region and said first side of the semiconductor substrate forms a first PN junction; a second impurity region of the second conductivity type shallowly diffused on a second side of said semiconductor substrate, said second side being opposite to said first side, wherein an interface between said second impurity region and said second side of the semiconductor substrate forms a first PN junction; and wherein said photodiode is configured to provide both a low pass filter response and a high pass filter response.

The first and second PN junctions are formed at a first depth and a second depth from a top surface of said semiconductor substrate, wherein the second depth is deeper than the first depth. The multi junction photodiode semiconductor device of claim 11, wherein said semiconductor substrate has a resistivity in a range of 100 to 10000 ohm-cm, and more particularly 4000 ohm-cm, and a thickness of in a range of 50 to 1000 microns, and more particularly, 400 microns.

The multi junction photodiode semiconductor device further comprising a first output electrode connected to said first impurity region; a second output electrode connected to said second impurity region; and a third output electrode connected to said semiconductor substrate, wherein said first and third output electrodes are output electrodes of the first PN junction, and said second and third output electrodes are output electrodes of the second PN junction. In one embodiment, the first conductivity type is p+. while the second conductivity type is n+. In another embodiment, the first conductivity type is n+ while the second conductivity type is p+. The dual junction photodiode semiconductor device further comprises an anti-reflective layer on said first side, which is about 100 to 3000 Angstroms, and more particularly 1000 Angstroms, thick.

BRIEF DESCRIPTION OF THE DRAWINGS

These and other features and advantages of the present invention will be appreciated, as they become better understood by reference to the following detailed description when considered in connection with the accompanying drawings, wherein.

DETAILED DESCRIPTION

The present invention is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

Figure 1A:
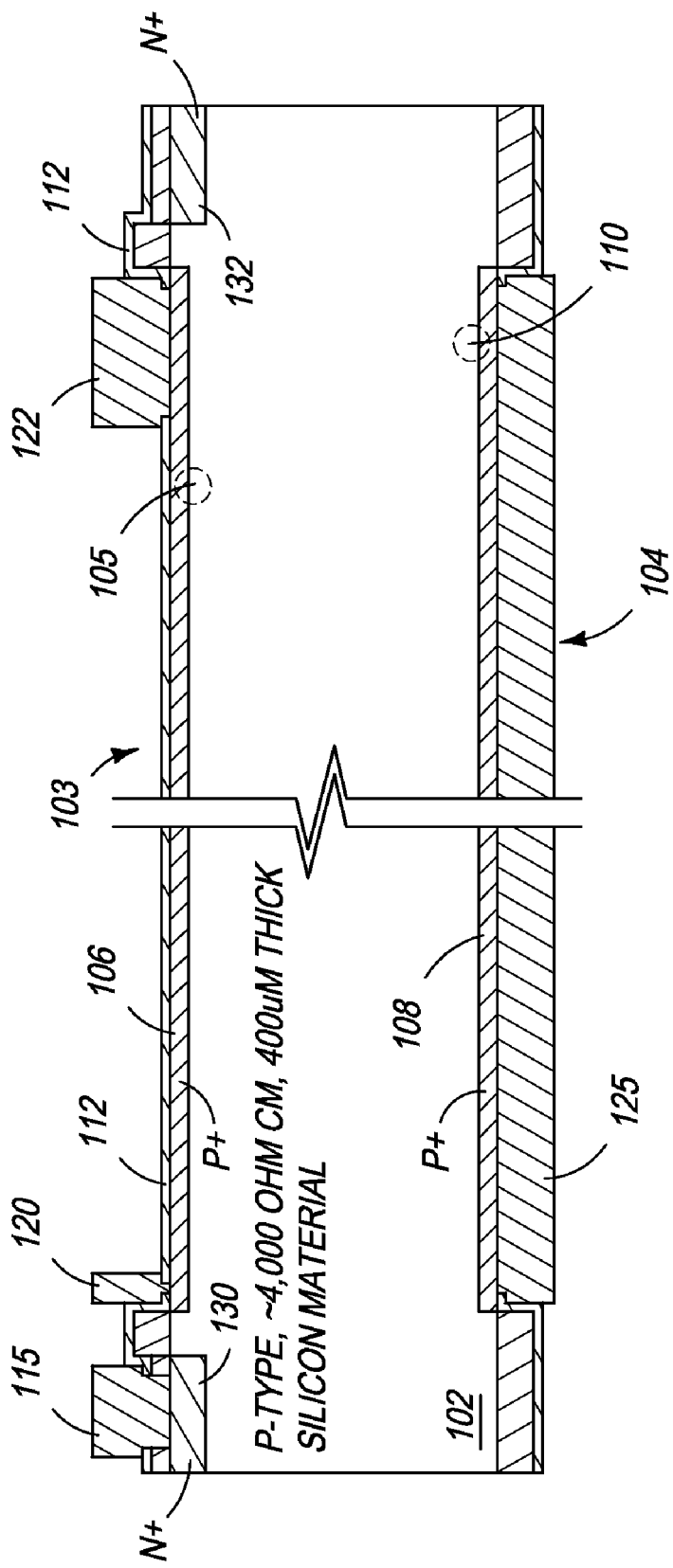
FIG. 1 shows a cross sectional view of a first embodiment of the wavelength sensitive sensor photodiode device of the present invention.

FIG. 1 shows a cross-sectional view of one embodiment of the wavelength sensitive sensor photodiode device 100 of the present invention. Referring to FIG. 1, in accordance with an aspect of the present invention, device 100 comprises substrate wafer 102, which, in one embodiment is N-type silicon having a thickness of about 0.130 mm. Persons of ordinary skill in the art would appreciate that the material and doping can be varied in alternate embodiments, as described below with respect to FIG. 4.

Since the light beam of a shorter wavelength is absorbed near the surface of a semiconductor, whereas the light beam of a longer wavelength reaches a deeper section, the present invention is a dual junction photoelectric semiconductor device 100 comprising: first junction 105 which comprises a shallow P+ layer 106 diffused into silicon substrate 102 on the front side 103 and second junction 110 which is comprised of a shallow P+ layer 108 diffused into N-type silicon substrate 102 on the back side 104. In one embodiment, shallow P+ layers 106 and 108 are comprised of boron. Anti-reflective layer 112 is deposited on the front side of device 100.

Use of dual junctions at two different depths, that is at the front and back sides, within the photodiode device 100 enables wavelength sensitivity across both short and long ranges of light wavelengths. In one embodiment, the photodiode is sensitive to wavelengths in the range of 200 nm to 800 nm. In another embodiment, the photodiode is sensitive to wavelengths in the range of 800 nm to 1100 nm. In another embodiment, the photodiode is concurrently sensitive to wavelengths in the range of 200 nm to 800 nm and wavelengths in the range of 800 nm to 1100 nm. In another embodiment, the photodiode is concurrently sensitive to wavelengths in the range of 200 nm to 800 nm and wavelengths in the range of 800 nm to 1100 nm and not to wavelengths below 200 nm. In another embodiment, the photodiode is concurrently sensitive to wavelengths in the range of 200 nm to 800 nm and wavelengths in the range of 800 nm to 1100 nm and not to wavelengths above 1100 nm. In another embodiment, the photodiode is concurrently sensitive to wavelengths in the range of 200 nm to 800 nm and wavelengths in the range of 800 nm to 1100 nm and not to wavelengths below 100 nm. In another embodiment, the photodiode is concurrently sensitive to wavelengths in the range of 200 nm to 800 nm and wavelengths in the range of 800 nm to 1100 nm and not to wavelengths above 1200 nm.

In another embodiment, the photodiode comprises a low pass filter sensitive to wavelengths in the range of 200 nm to 800 nm and high pass filter sensitive to wavelengths in the range of 800 nm to 1100 nm. In another embodiment, the photodiode comprises a low pass filter sensitive to wavelengths in the range of 200 nm to 800 nm and high pass filter sensitive to wavelengths in the range of 800 nm to 1100 nm and does not filter wavelengths below 200 nm. In another embodiment, the photodiode comprises a low pass filter sensitive to wavelengths in the range of 200 nm to 800 nm and high pass filter sensitive to wavelengths in the range of 800 nm to 1100 nm and does not filter wavelengths between above 1100 nm. In another embodiment, the photodiode comprises a low pass filter sensitive to wavelengths in the range of 200 nm to 800 nm and high pass filter sensitive to wavelengths in the range of 800 nm to 1100 nm and does not filter wavelengths below 100 nm or above 1200 nm.

Front-side metal contact pads 115, 120, 122 and back-side metallization 125 provide necessary electrical contacts for the photodiode 100. N+ deposition areas 130, 132 provide ohmic contacts. Thus, electrode terminals comprising cathode 115 and anode 122 in combination, form output terminals of a first photodiode $PD_1$ associated with the first junction 105, while cathode 115 and back-side anode 125 form output terminals of a second photodiode $PD_2$ associated with the second junction 110.

Figure 2A:
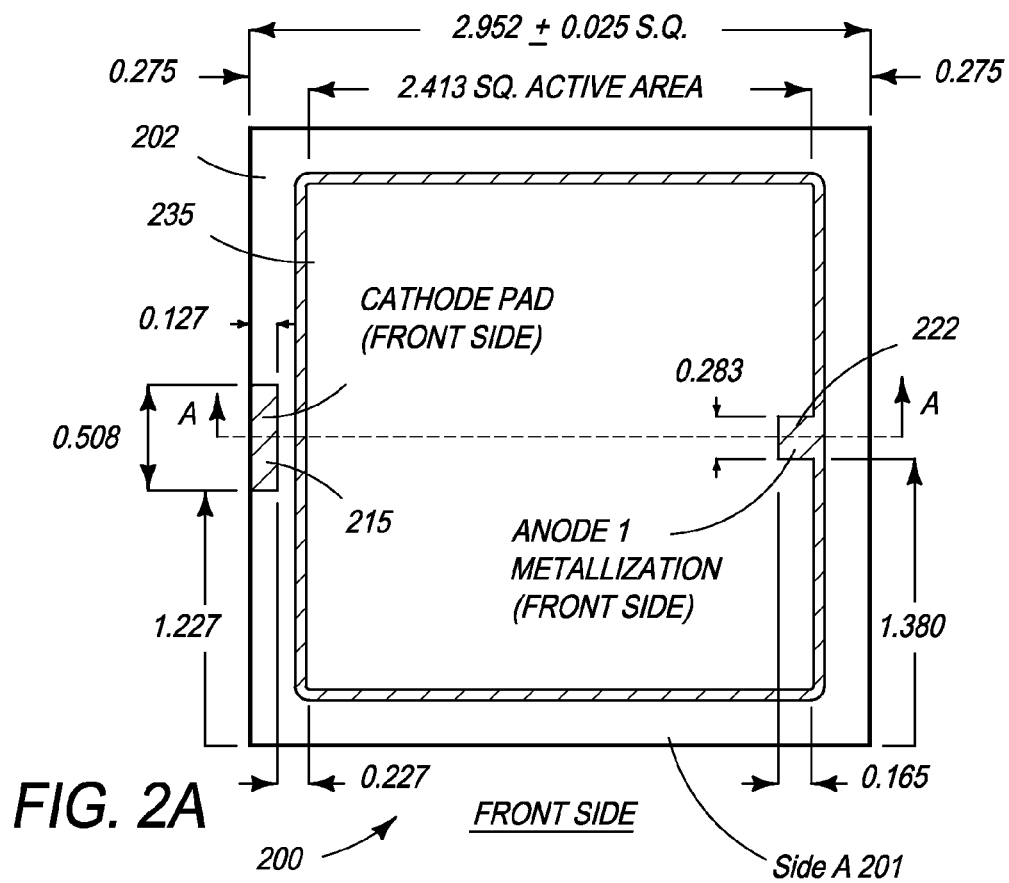
FIG. 2a shows front side view of a first embodiment of the wavelength sensitive sensor photodiode device of the present invention.
Figure 2B:
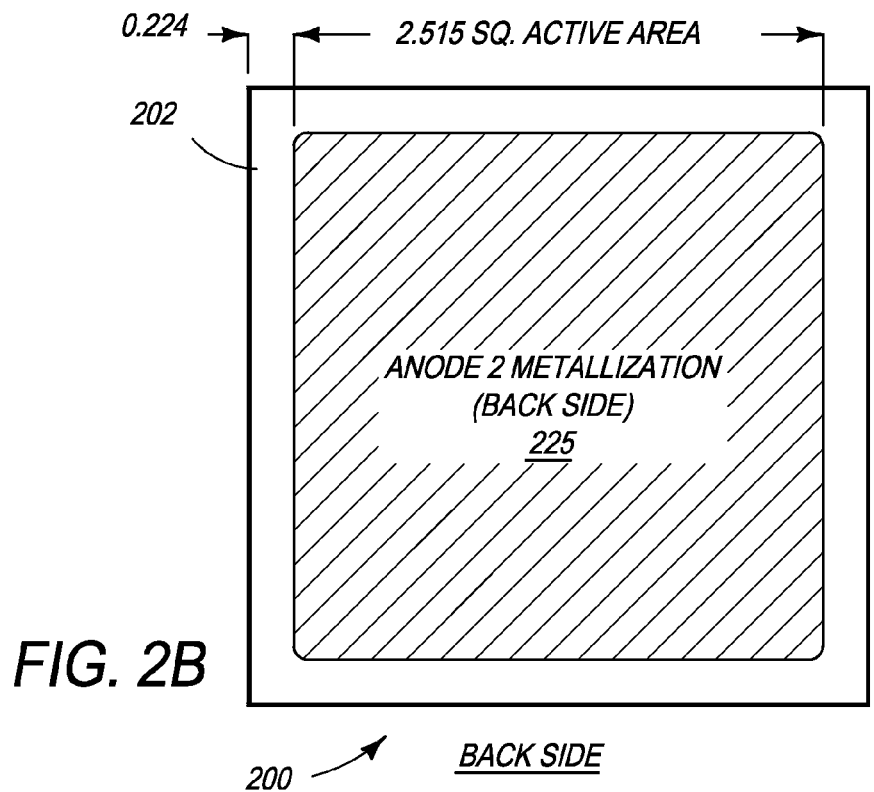
FIG. 2b shows back side view of a first embodiment of the wavelength sensitive sensor photodiode device of the present invention.

FIGS. 2a and 2b depict front and back sides, respectively, along with exemplary dimensional specifications of one embodiment of the photodiode of the present invention. Referring to FIG. 2a, in one embodiment, device substrate 202 is a square of 2.962±0.025 mm each side while the front side active area 235 is a square of 2.413 mm each side. The front side cathode pad 215 is 0.508 mm in length and 0.127 mm in width. Cathode pad 215 is 1.227 mm from side A 201 and 0.127 mm from the nearest edge of the active area 235. The front side anode pad 222 is 0.203 mm in length and 0.165 mm in width. Anode pad 222 is 1.380 mm from side A 201 of the photodiode. Referring to FIG. 2b, the back side active area 240 is also a square of 2.515 mm each side defined by the back side anode metallization 225. The sides of the anode metallization 225 are about 0.224 mm away from the outer edges of the device substrate 202.

The manufacturing process of one embodiment of the wavelength sensitive sensor photodiode of the present invention will now be described in greater detail. Persons of ordinary skill in the art should note that although one exemplary manufacturing process is described herein, various modifications may be made without departing from the scope and spirit of the invention. Reference is now made to FIG. 1, which is a cross sectional view of one embodiment of the photodiode of the present invention, and FIGS. 3a through 31 which are also cross-sectional views of the photodiode of FIG. 1, illustrating exemplary manufacturing steps of the embodiment. Modifications or alterations to the manufacturing steps, their corresponding details, and any order presented may be readily apparent to those of ordinary skill in the art. Thus, the present invention contemplates many possibilities for manufacturing the sensor photodiode of the present invention and is not limited to the examples provided herein.

Figure 3A:
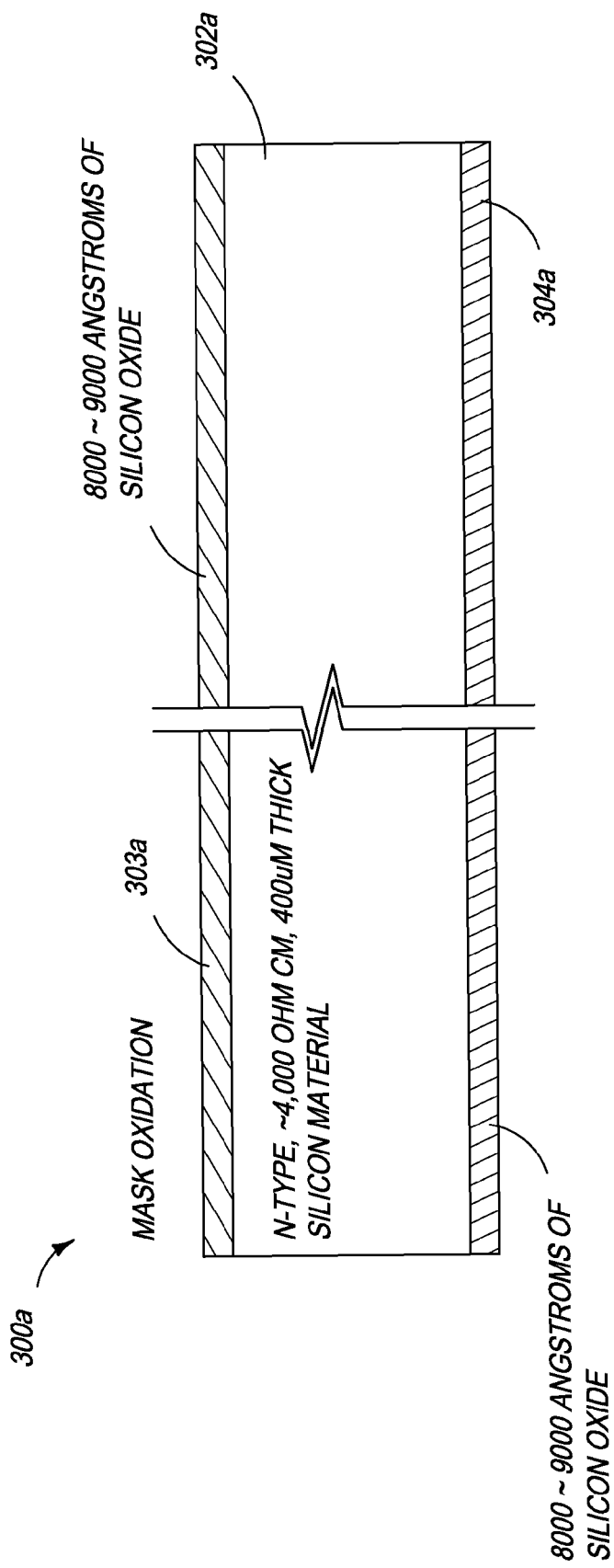
FIG. 3a shows the step of mask oxidation in a first embodiment of the wavelength sensitive photodiode device of the present invention.

FIG. 3a depicts the first step for manufacturing of sensor photodiode 300a of the present invention, where the starting material of the photodiode is substrate wafer 302a. In one embodiment the wafer 302a is N-type silicon having a resistivity of about 4,000 ohm-cm, and 400 μm thick. The device wafer 302a is polished on both sides to allow greater conformity to parameters, surface flatness, and specification thickness. However, it should be understood by those of ordinary skill in the art that the above specifications are not binding and that the material type and wafer size can be easily changed to suit the design, fabrication, and functional requirements of the present invention. The device wafer 302a is subjected to a standard mask oxidation process that grows silicon oxide layers 303a, 304a on front and back sides, respectively, of the device wafer. In one embodiment, the oxidation mask is made of silicon oxide ($SiO_2$) or silicon nitride ($Si_3N_4$) and thermal oxidation is employed to achieve mask oxidation. In one embodiment, the oxide layers 303a, 304a have a thickness ranging from 8000 to approximately 9000 Angstroms.

Figure 3B:
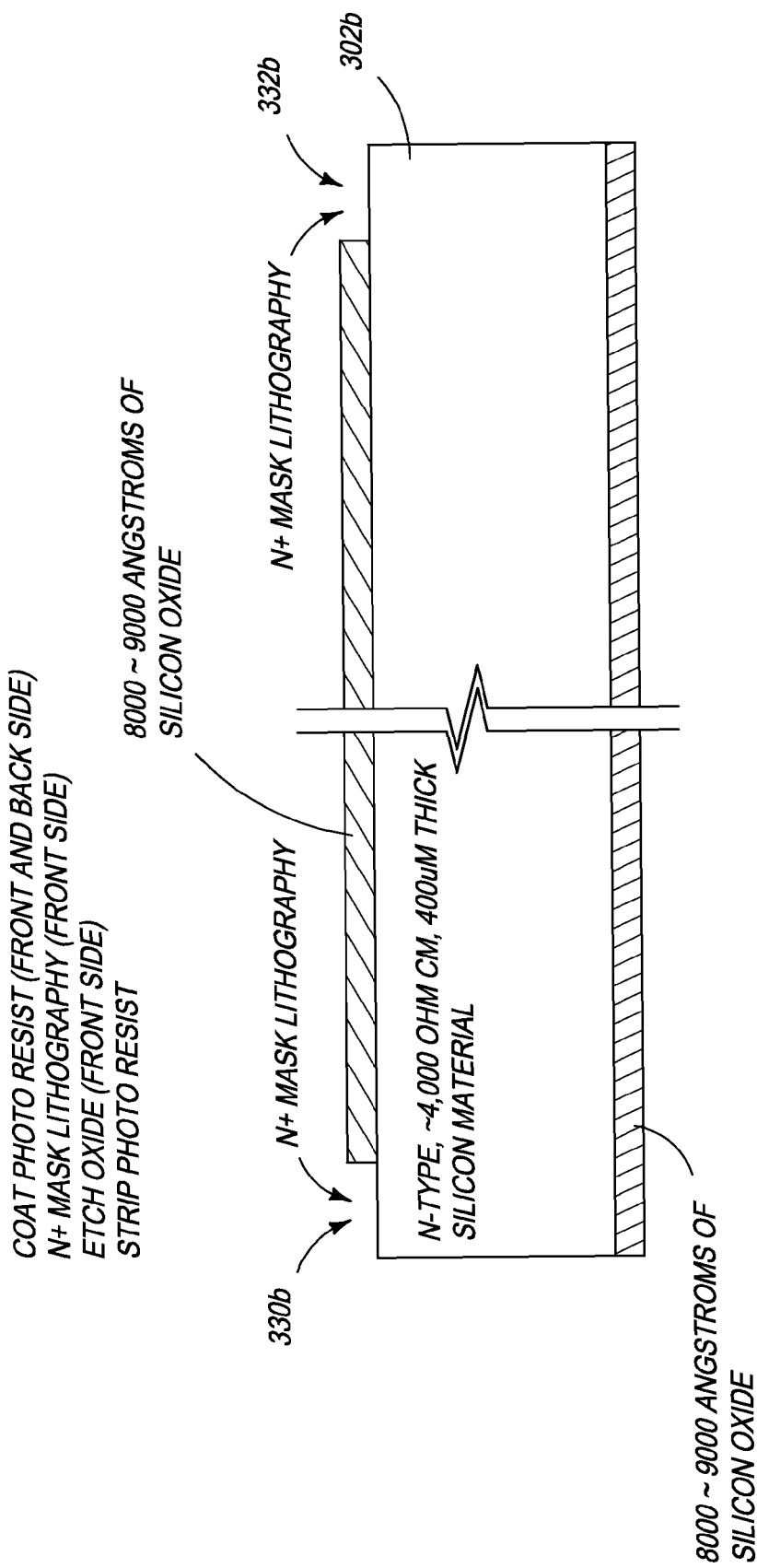
FIG. 3b shows the steps of N+ mask lithography and oxide etching on front side in a first embodiment of the wavelength sensitive photodiode device of the present invention.

As shown in FIG. 3b, after the standard mask oxidation is complete, during the next step the device wafer 302b is subjected to n+ photolithography on the front-side. Photolithography includes employing a photoresist layer to etch a specific pattern on the surface of the wafer. Generally, the photoresist layer is a photosensitive polymeric material for photolithography and photoengraving that can form a patterned coating on the surface. After selecting a suitable material and creating a suitable photoresist pattern, a thin photoresist layer is applied to the front side of the device wafer 302b. In one embodiment, the photoresist layer is applied via a spin coating technique. Spin coating is well-known to those of ordinary skill in the art and will not be described in detail herein. The photoresist layer is then appropriately treated to reveal n+ diffusion regions 330b, 332b.

In one embodiment of the present invention, the device wafer 302b is subjected to n+ masking. N+ masking is employed to protect portions of device wafer 302b. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 302b is aligned with the n+ mask. An intense light, such as UV light, is projected through the mask, exposing the photoresist layer in the pattern of the n+ mask. The n+ mask allows selective irradiation of the photoresist on the device wafer. Regions that are exposed to radiation are hardened while those that are reserved for deep diffusion remain shielded by the n+ mask and easily removed. The exposed and remaining photoresist is then subjected to a suitable chemical or plasma etching to reveal the pattern transfer from the mask to the photoresist layer. An etching process is then employed to remove the silicon dioxide layer. In one embodiment, the pattern of the photoresist layer and/or n+ mask defines regions 330b, 332b devoid of the oxide layer 303a (deposited as shown in FIG. 3a) and is ready for n+ diffusion.

Figure 3C:
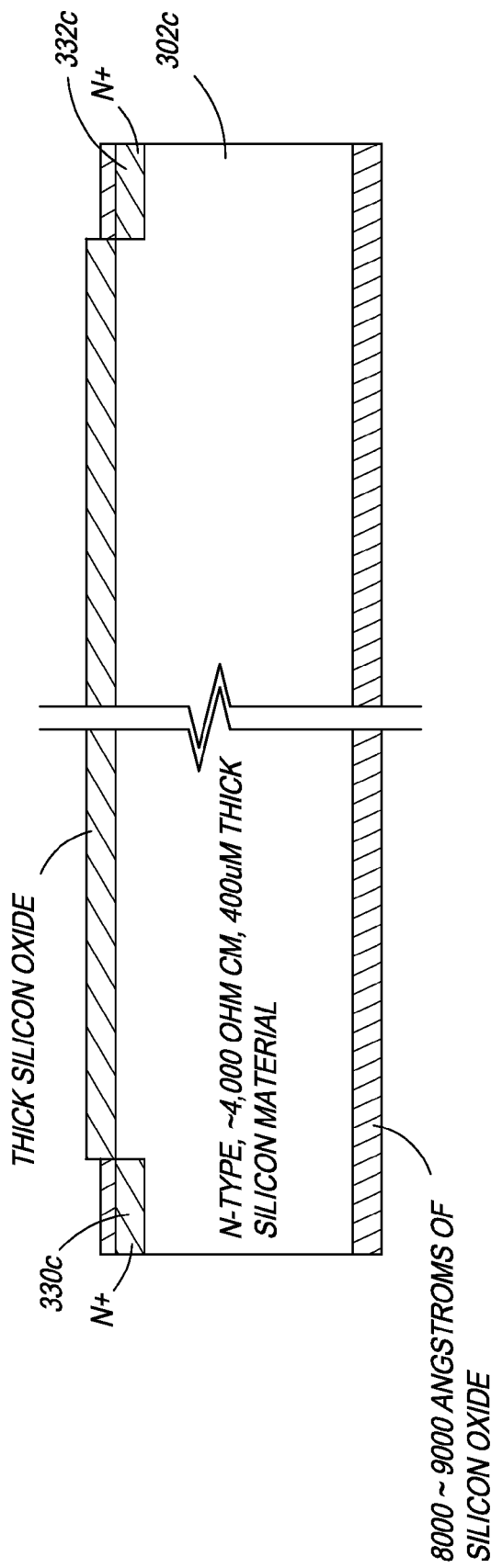
FIG. 3c shows the steps of N+ deposition followed by drive-in oxidation on the front side in a first embodiment of the wavelength sensitive photodiode device of the present invention.

Now referring to FIG. 3c, in the next step the device wafer 302c is subjected to N+ deposition 330c, 332c followed by drive-in oxidation. This N+ diffusion enables necessary ohmic contacts. An appropriate amount of dopant atoms is deposited onto the substrate wafer 302c and fills the gaps left by the removed photoresist layer. In one embodiment, the dopant atoms deposited may include phosphorous dopant atoms. Thereafter, the wafer 302c is subjected to a drive-in oxidation process that is used to redistribute the dopant atoms and deposit them deeper into the wafer. In addition, exposed silicon surfaces are oxidized.

Figure 3D:
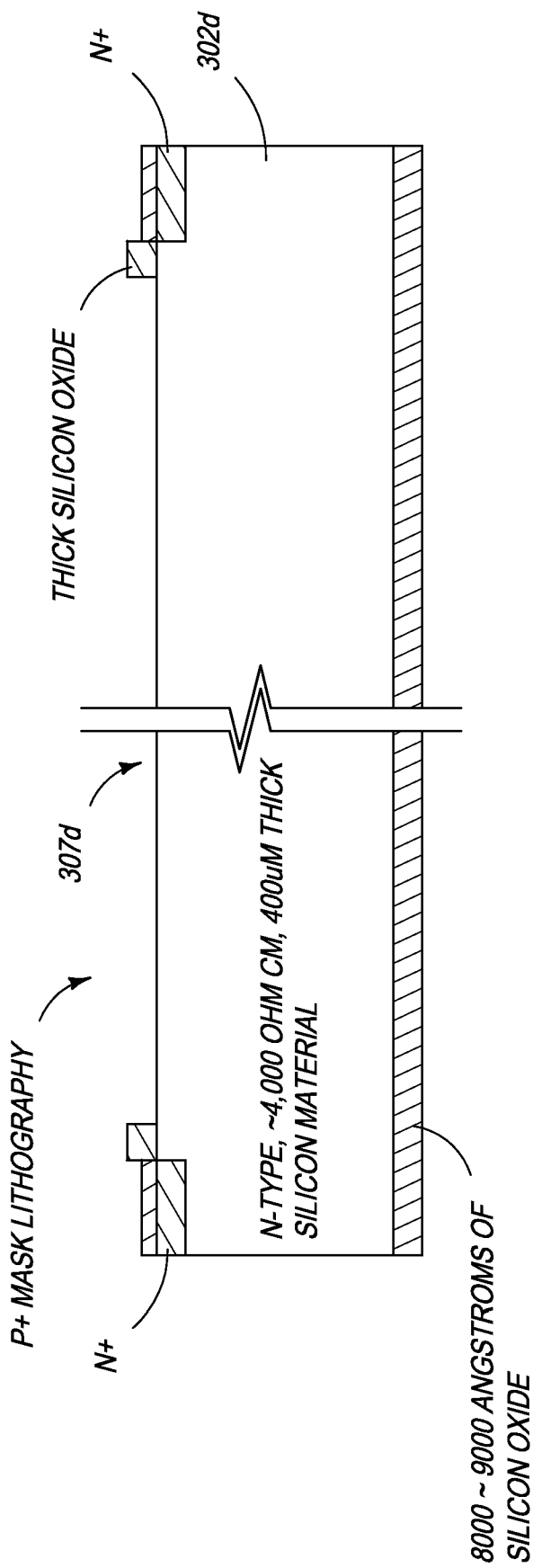
FIG. 3d shows the steps of p+ mask lithography on front side followed by oxide etching on front side in a first embodiment of the wavelength sensitive photodiode device of the present invention.
Figure 3E:
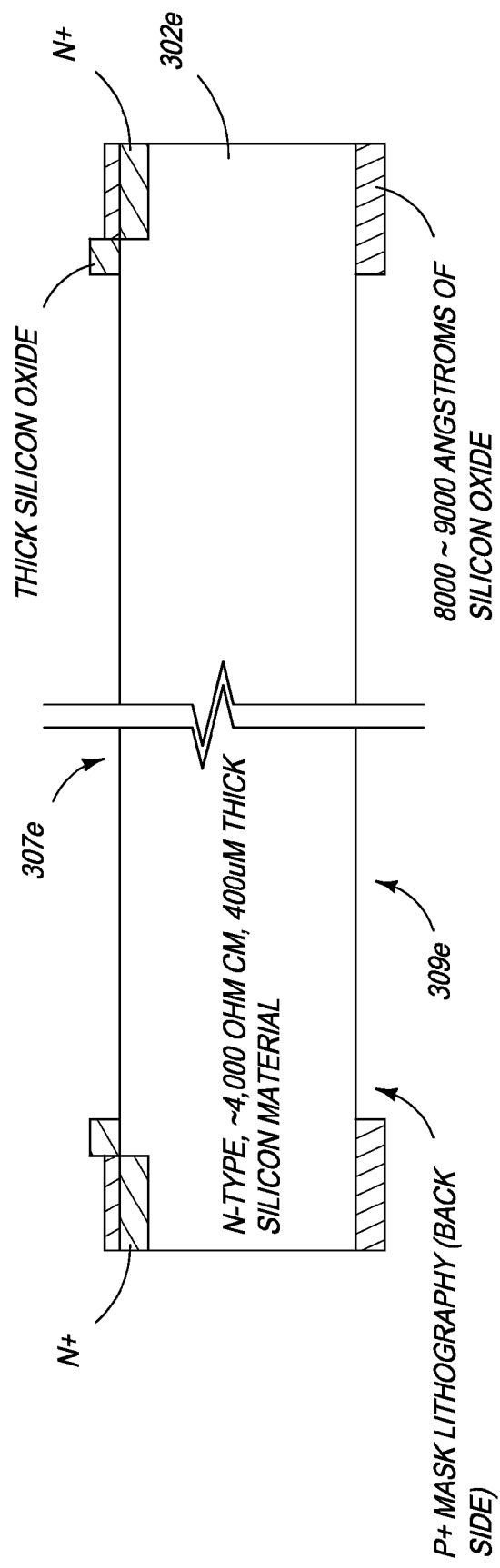
FIG. 3e shows the steps of p+ mask lithography on back side followed by oxide etching on back side in a first embodiment of the wavelength sensitive photodiode device of the present invention.

Referring now to FIGS. 3d and 3e, during subsequent steps of fabrication, the front and back sides of the device wafer 302d, 302e undergo p+ photolithography process to create regions 307d, 309e along with oxide etching on front and back sides, respectively. As with any conventional photolithography process, p+ photolithography comprises of the following tasks: substrate preparation; photoresist application; soft baking; mask alignment; exposure development, hard baking, and etching. In addition various other chemical treatments may be performed. In one embodiment, the pattern of the photoresist layer and/or p+ mask defines regions 307d, 309e on the front and back sides respectively. Both regions 307d, 309e are devoid of oxide layers 303a, 304a shown in FIG. 3a, and ready for p+ diffusion.

Figure 3F:
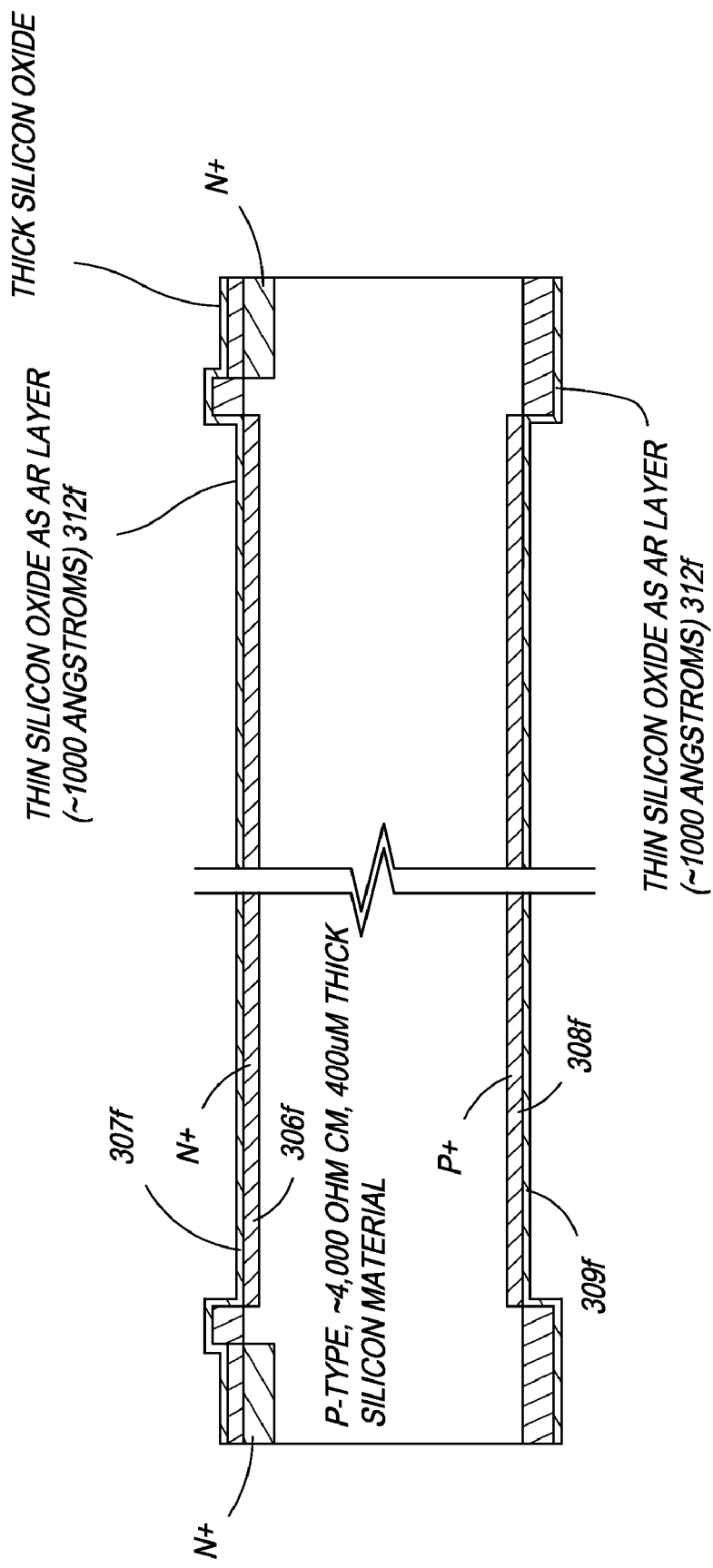
FIG. 3f shows the steps of p+ diffusion and drive-in oxidation on front and back sides in a first embodiment of the wavelength sensitive photodiode device of the present invention.

As shown in FIG. 3f, during the next step of fabrication, regions 307f, 309f are subjected to p+ diffusion and drive-in oxidation to develop p+ diffusion layers 306f, 308f on front and back sides respectively. The diffusion and drive-in oxidation allows predefined and/or predetermined thermal budget in accordance with the principles of the present invention. In one embodiment of the present invention the p+ dopant is boron. In addition, exposed p+ diffused regions 307f, 309f are oxidized with thin anti-reflective layers 312f that in one embodiment are of silicon oxide and about 1000 Angstrom thick.

Figure 3G:
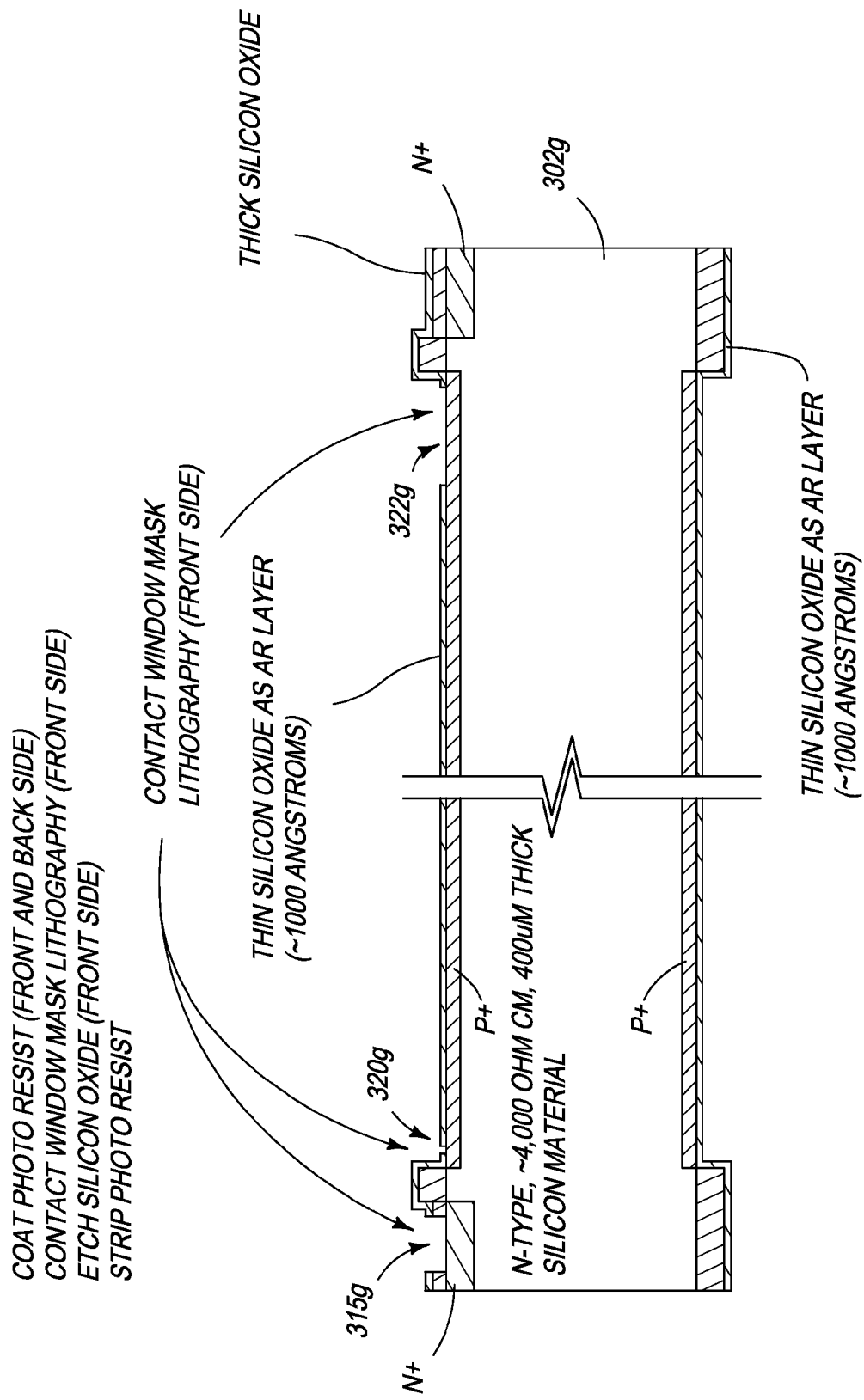
FIG. 3g shows the steps of contact window mask lithography on front side followed by oxide layer etching on front side in a first embodiment of the wavelength sensitive photodiode device of the present invention.

In the next step shown in FIG. 3g, a photo resist layer is applied on the front and back sides of the device wafer 302g and a contact window mask is etched on the front-side of the device wafer. The contact mask is formed on the front-side of the device wafer 302g by using standard semiconductor technology photolithography techniques. As with any conventional photolithography process, contact window mask lithography comprises of the following tasks: substrate preparation; photoresist application; soft baking; mask alignment; exposure development, hard baking, and etching. In one embodiment, contact windows 315g, 320g, 322g are formed by removing the anti-reflective layer using either standard wet or standard dry etching techniques on the front-side of the device wafer.

Figure 3H:
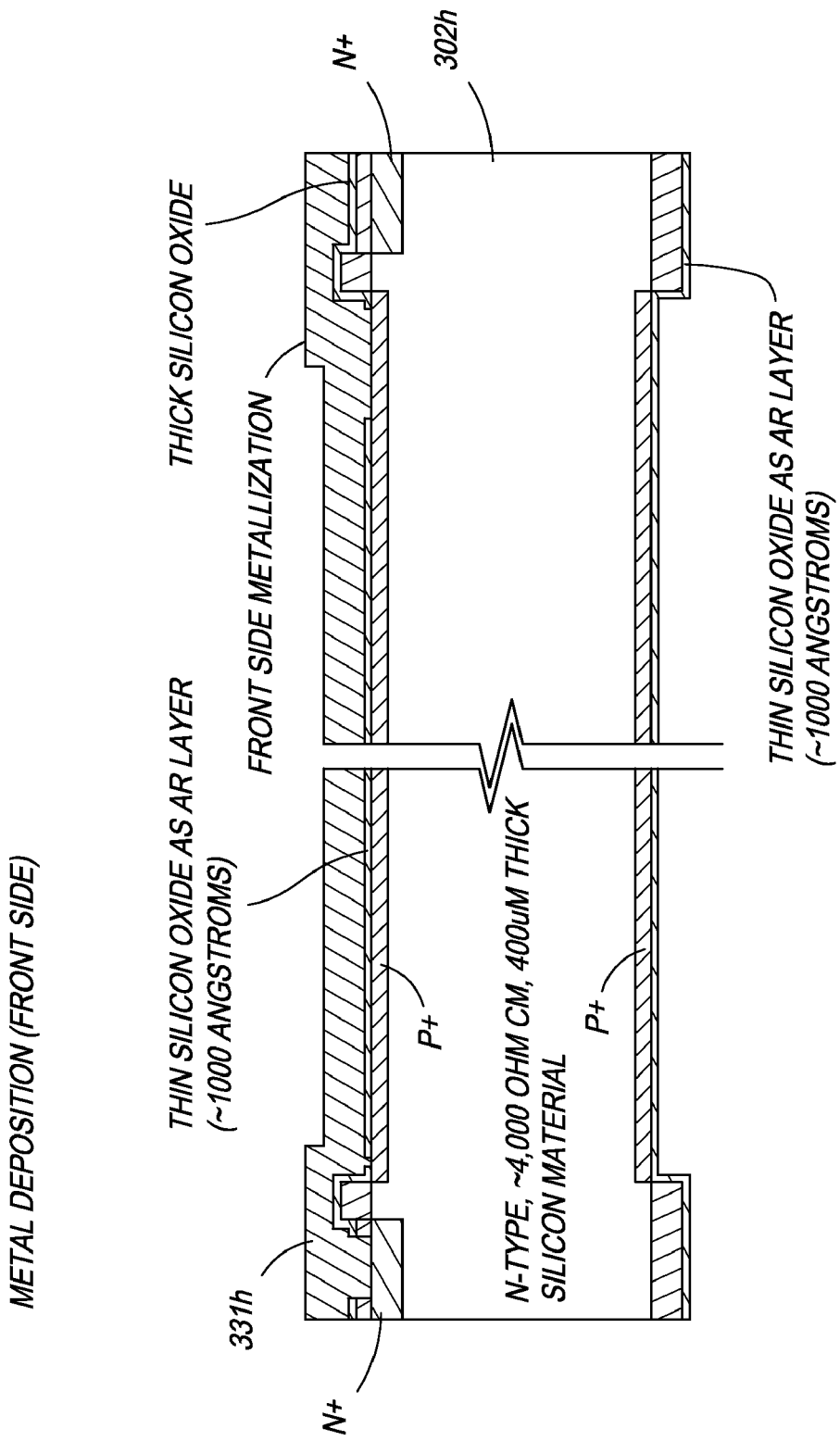
FIG. 3h shows the step of depositing metal on front side in a first embodiment of the wavelength sensitive photodiode device of the present invention.

In the next step, as shown in FIG. 3h, metal deposition is carried out on front side of the device wafer 302h. In the metal deposition process, also known as metallization, metal layers 331h are deposited on the wafer to create conductive pathways. The most common metals include aluminum, nickel, chromium, gold, germanium, copper, silver, titanium, tungsten, platinum and tantalum.

Figure 3I:
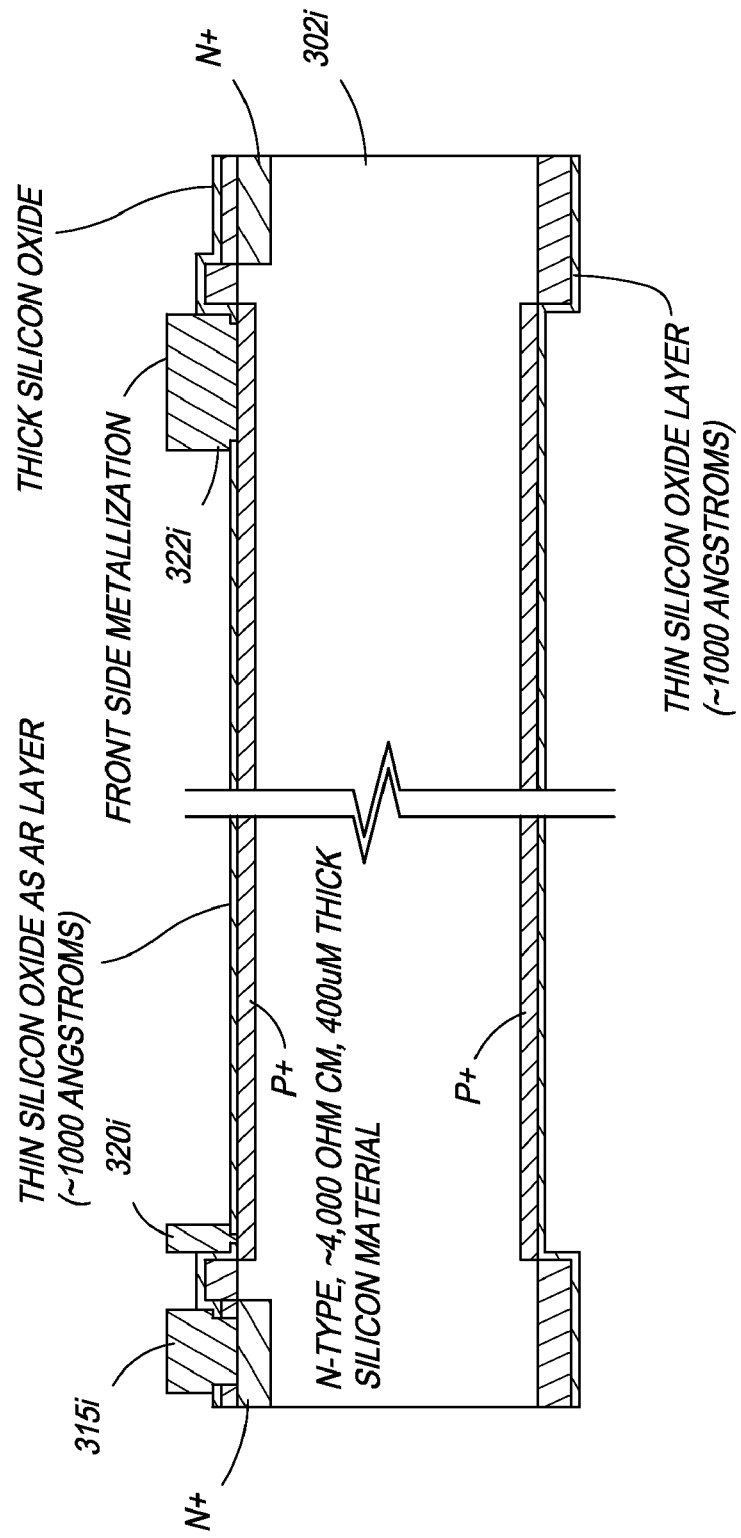
FIG. 3i shows the steps of metal mask lithography on front side followed by metal etching in a first embodiment of the wavelength sensitive photodiode device of the present invention.

Referring to FIG. 3i, during the next step, the front-side of the device wafer 302i undergoes a process of metal lithography thereby forming front-side metal contacts 315i, 320i, 322i. These metal contacts provide the necessary interface between the various devices and the photodiodes/photodiode arrays and for creating electrical connections to n+ and p+ diffused regions. In one embodiment of the present invention the front-side of the device wafer 302i is metal etched. Metal etching can be performed in a variety of methods including but not limited to abrasive etching, dry etching, electro etching, laser etching, photo etching, reactive ion etching, sputter etching, and vapor phase etching.

Figure 3J:
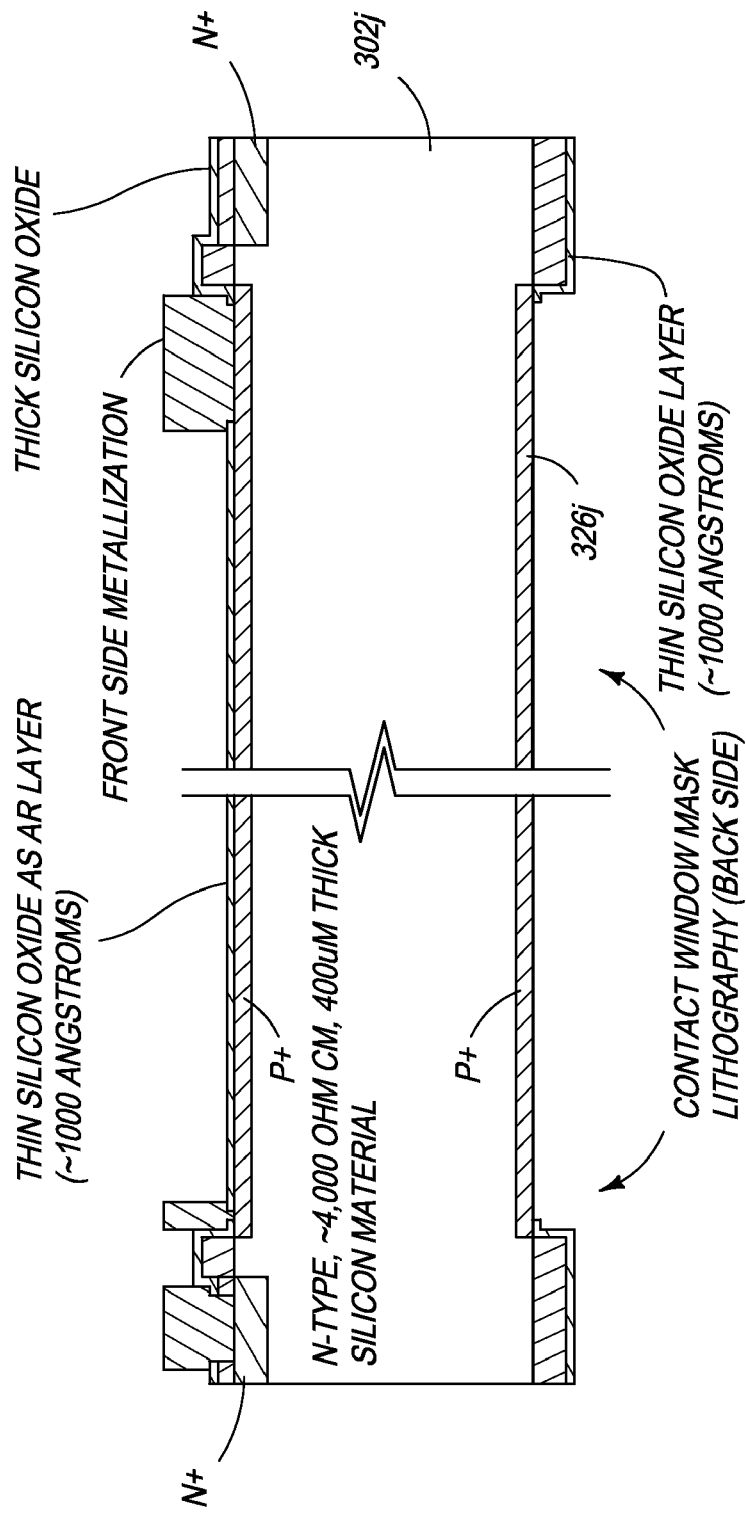
FIG. 3j shows the steps of contact window mask lithography on back side followed by etching oxide layer on back side in a first embodiment of the wavelength sensitive photodiode device of the present invention.

Referring now to FIG. 3j, at the next step a contact window mask is etched on the back-side of the device wafer 302j. The contact mask is formed on the front-side of the device wafer 302j by using standard semiconductor technology photolithography techniques comprising of the following tasks: substrate preparation; photoresist application; soft baking; mask alignment; exposure development, hard baking, and etching. In one embodiment, contact window 326j is formed by removing the anti-reflective layer using either standard wet or standard dry etching techniques on the back-side of the device wafer.

Figure 3K:
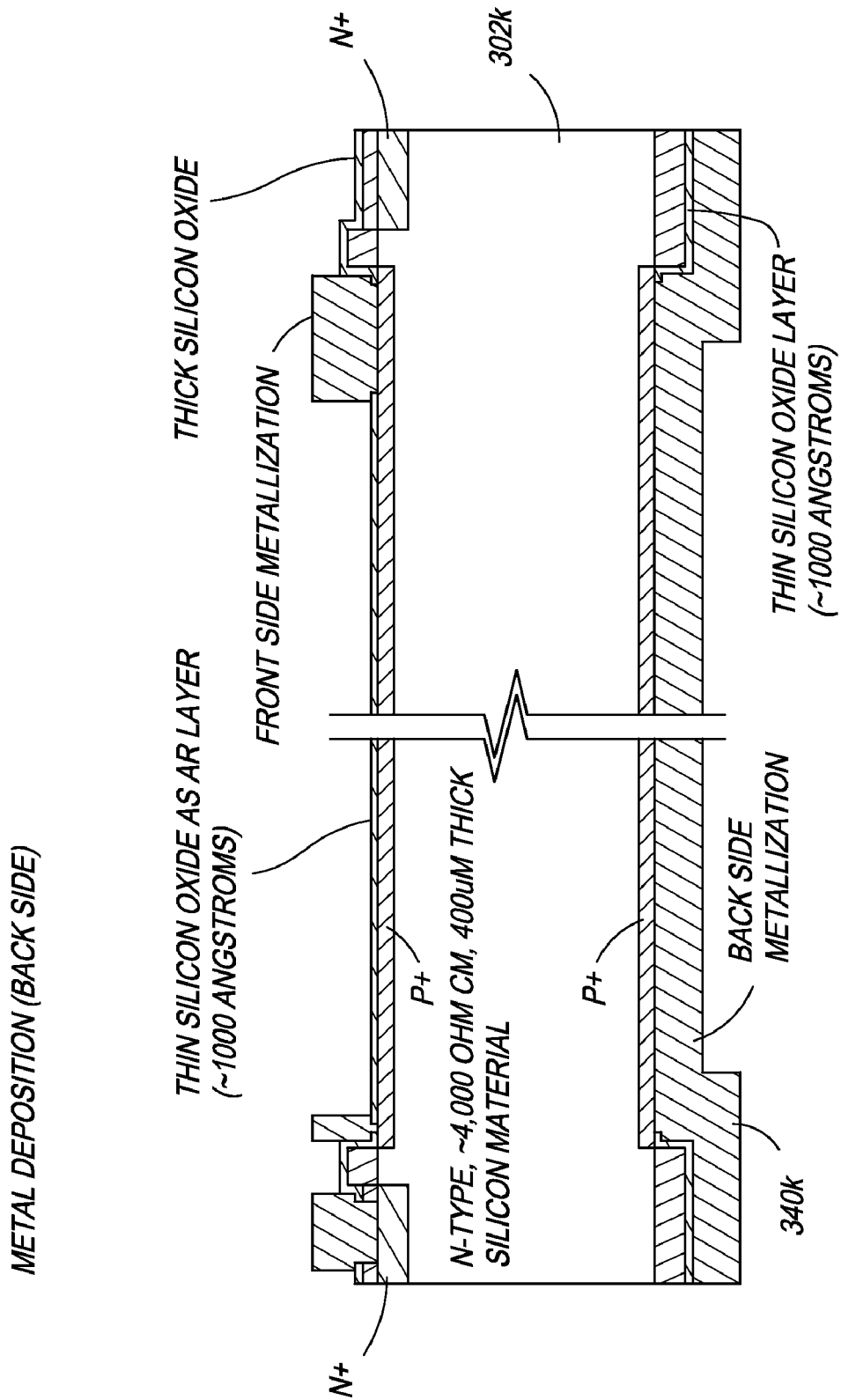
FIG. 3k shows the step of depositing metal on back side in a first embodiment of the wavelength sensitive photodiode device of the present invention.
Figure 3L:
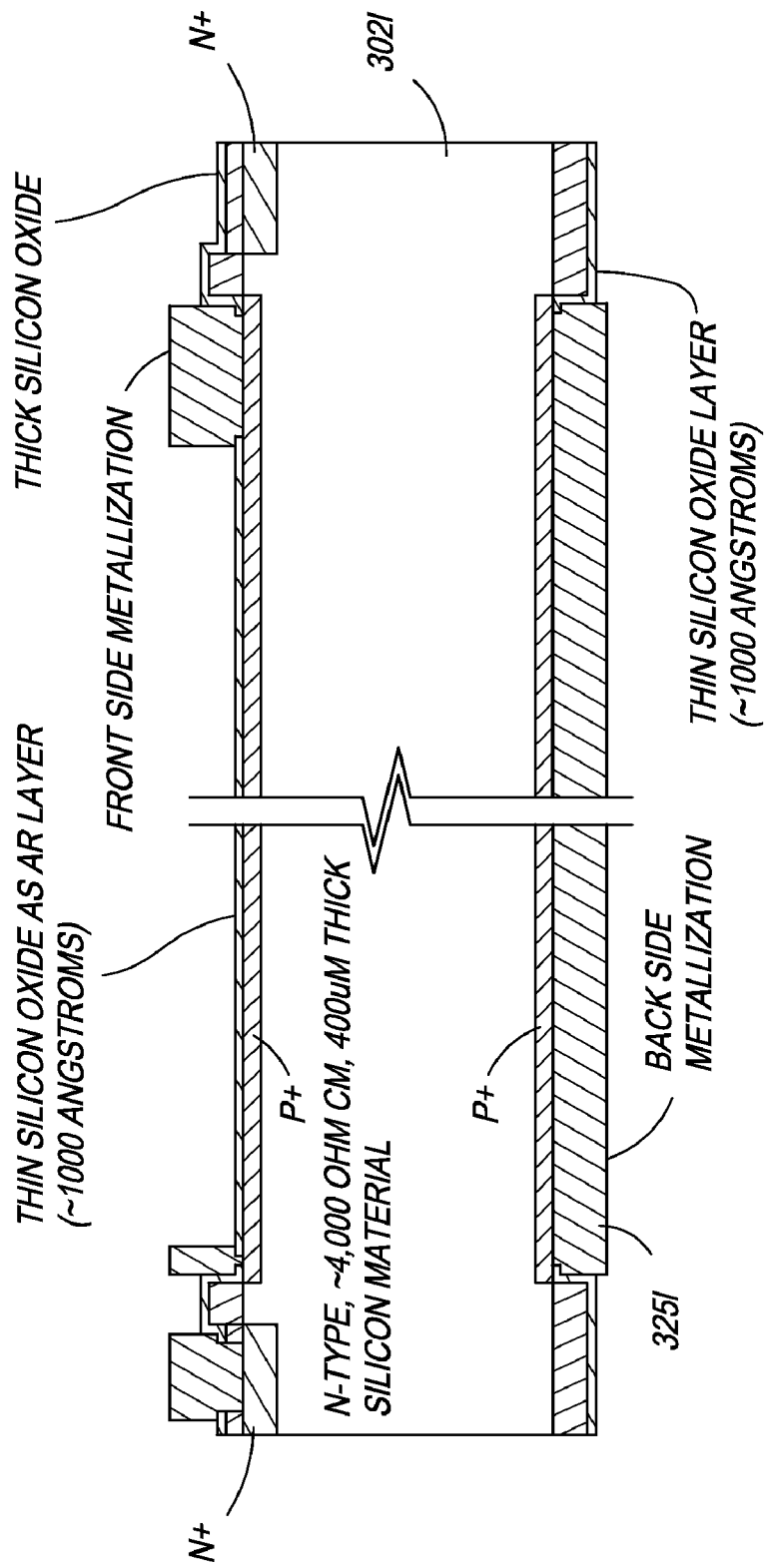
FIG. 3l shows the step of metal mask lithography on back side followed by metal etching in a first embodiment of the wavelength sensitive photodiode device of the present invention.

During the next step, as shown in FIG. 3k, a layer of metal 340k is deposited on the back side of the device wafer 302k. In the next step shown in FIG. 3l, the back-side of the device wafer 302l undergoes metal lithography thereby forming back-side metal contact 325l. In one embodiment of the present invention the back-side of the device wafer 302l is metal etched.

Figure 4:
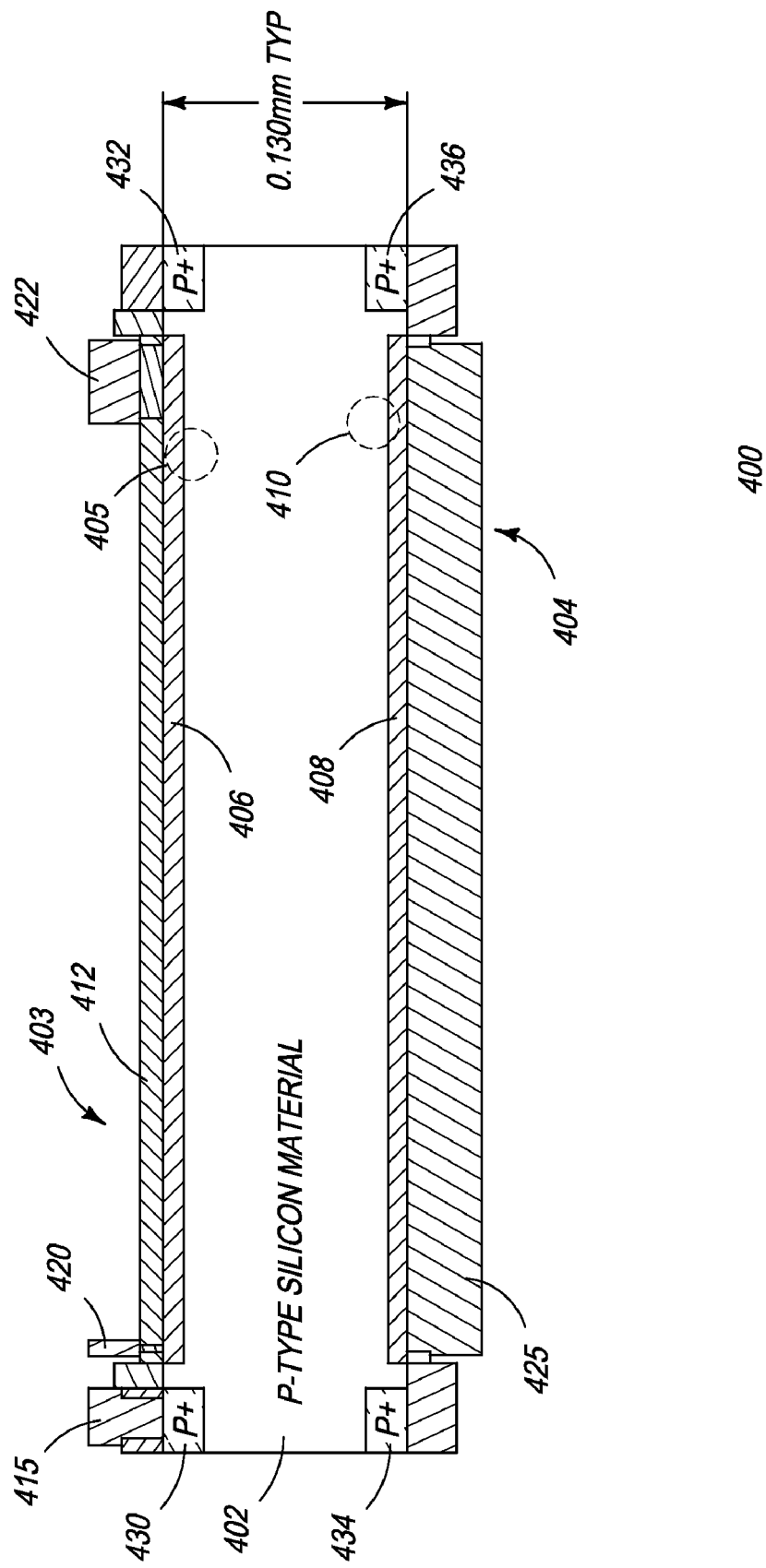
FIG. 4 shows a cross sectional view of a second embodiment of the wavelength sensitive sensor photodiode device of the present invention.

FIG. 4 shows a cross-sectional view of another embodiment of the wavelength sensitive sensor photodiode device of the present invention. Referring to FIG. 4, in accordance with an aspect of the present invention, device 400 comprises substrate wafer 402, which, in one embodiment is P-type silicon having a thickness of about 0.130 mm. Persons of ordinary skill in the art would appreciate that the material and doping can be varied in alternate embodiments. Since the light beam of a shorter wavelength is absorbed near the surface of a semiconductor, whereas the light beam of a longer wavelength reaches a deeper section, the present invention is a dual junction photoelectric semiconductor device 400 comprising: first junction 405 which comprises a shallow N+ layer 406 diffused into silicon substrate 402 on the front side 403 and second junction 410 which is comprised of a shallow N+ layer 408 diffused into P-type silicon substrate 402 on the back side 404. In one embodiment, shallow N+ layers 406 and 408 are comprised of phosphorous. Anti-reflective layer 412 is deposited on the front side 403 of device 400.

Use of dual junctions at two different depths, that is at the front and back sides, within the photodiode device 400 enables wavelength sensitivity across both short and long ranges of light wavelengths. Front-side metal contact pads 415, 420, and 422 and back-side metallization 425 provide necessary electrical contacts for the photodiode 400. Front side P+ deposition channels 430, 432 provide ohmic contacts.

High resistivity P-type silicon is prone to surface inversion (whereby P-type becomes N-type) due to the positive charges that are always present in the passivated oxide. When the P-surface is inverted to N-surface, an N-type surface channel is generated, which will connect the N+ active area junction to the edge of the chip, resulting in high dark leakage current. In order to avoid the connection to the surface inversion area, a heavily doped (greater than $1 \times 10^{19}$ cm$^3$) P+ ring needs to be implanted or diffused surrounding the active N+ zone, since it is very difficult and nearly impossible to invert heavily doped P+ zone to N-type). Thus, a P+ ring or backside P+ deposition channels 434, 436 are employed to disconnect the N+ active junction from the N-type surface channel, thereby keeping the dark current of the N+ junction low.

Figure 5A:
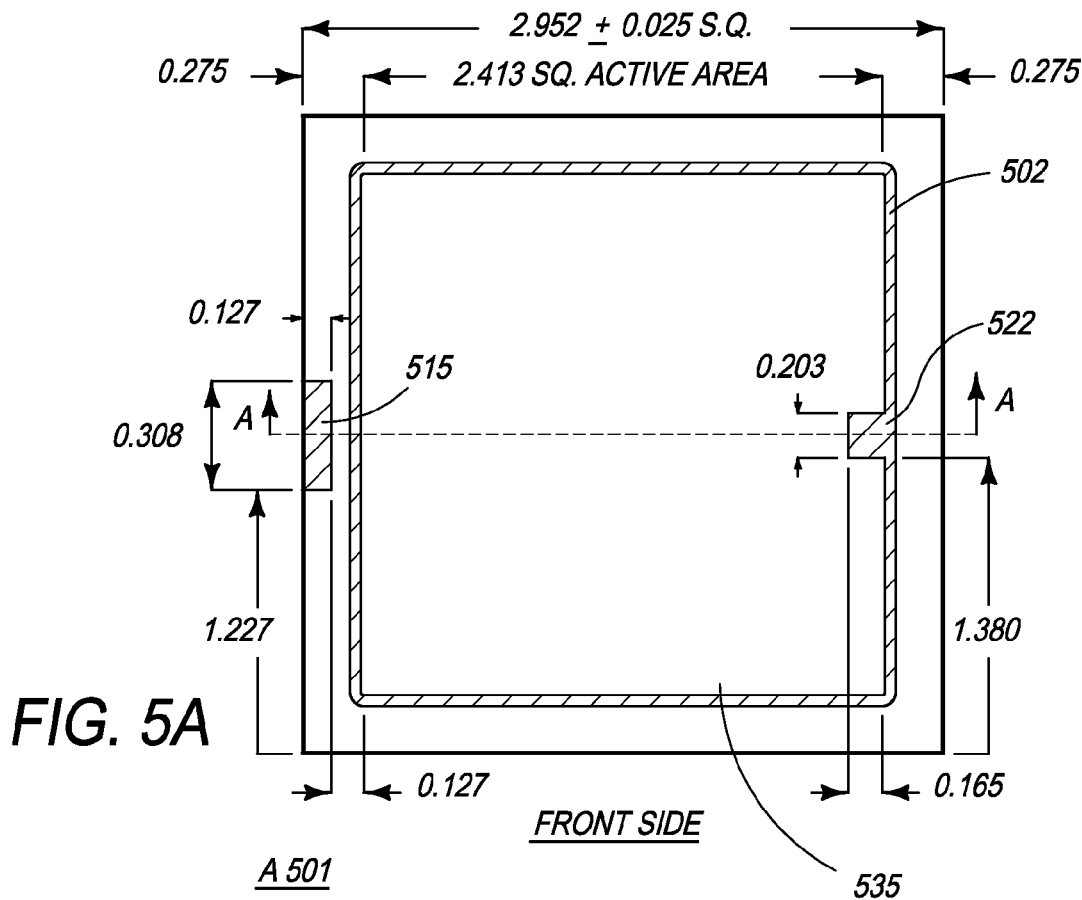
FIG. 5a shows a front side view of a second embodiment of the wavelength sensitive sensor photodiode device of the present invention.
Figure 5B:
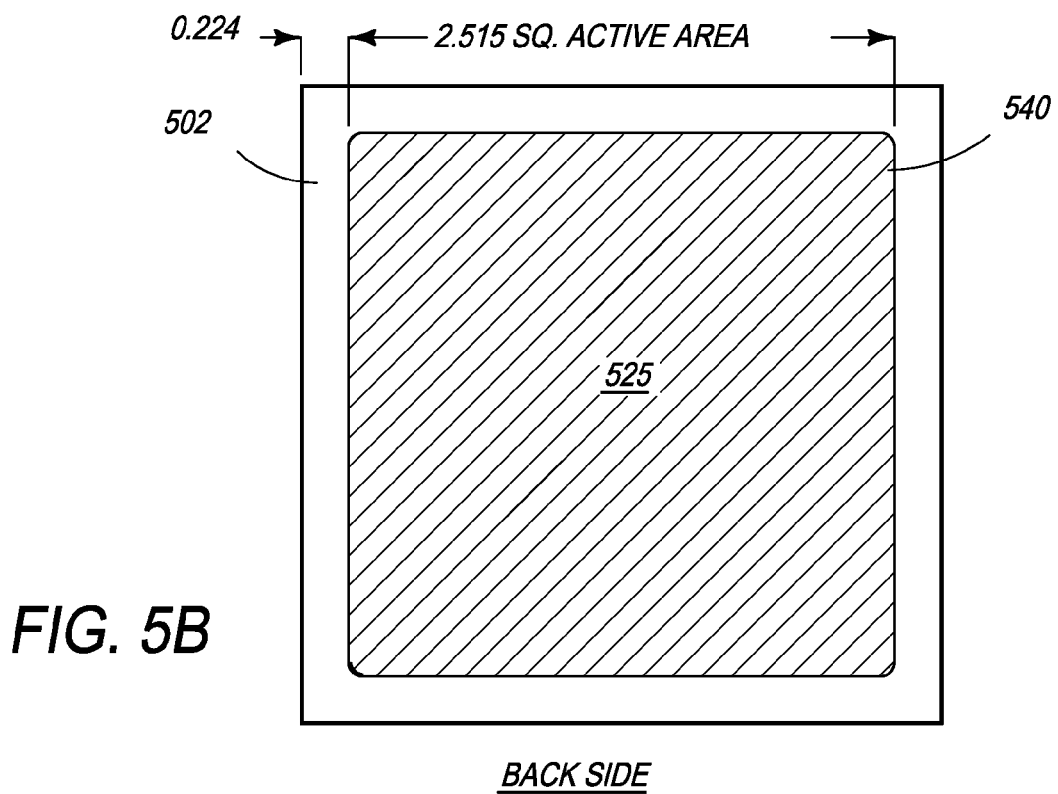
FIG. 5b shows a back side view of a second embodiment of the wavelength sensitive sensor photodiode device of the present invention.

FIGS. 5a and 5b show front and back sides, respectively, along with exemplary dimensional specifications of one embodiment of the photodiode of the present invention. Referring to FIG. 5a, in one embodiment, the device substrate 502 is a square of 2.962±0.025 mm each side while the front side active area 535 is a square of 2.413 mm each side. The front side anode pad 515 is 0.508 mm in length and 0.127 mm in width. Anode pad 515 is 1.227 mm from side A 501 and 0.127 mm from the nearest edge of the active area 535. The front side cathode pad 522 is 0.203 mm in length and 0.165 mm in width. Cathode pad 522 is 1.380 mm from side A 501 of the photodiode. Referring to FIG. 5b, the back side active area 540 is also a square of 2.515 mm each side defined by the back side metallized cathode layer 525. The sides of the metallized cathode layer 525 are about 0.224 mm away from the outer edges of the device substrate 502.

Reference is now made to FIGS. 6a through 6m, which are cross-sectional views illustrating exemplary manufacturing steps for the embodiment of photodiode shown in FIG. 4. Modifications or alterations to the manufacturing steps, their corresponding details, and any order presented may be readily apparent to those of ordinary skill in the art.

Figure 6A:
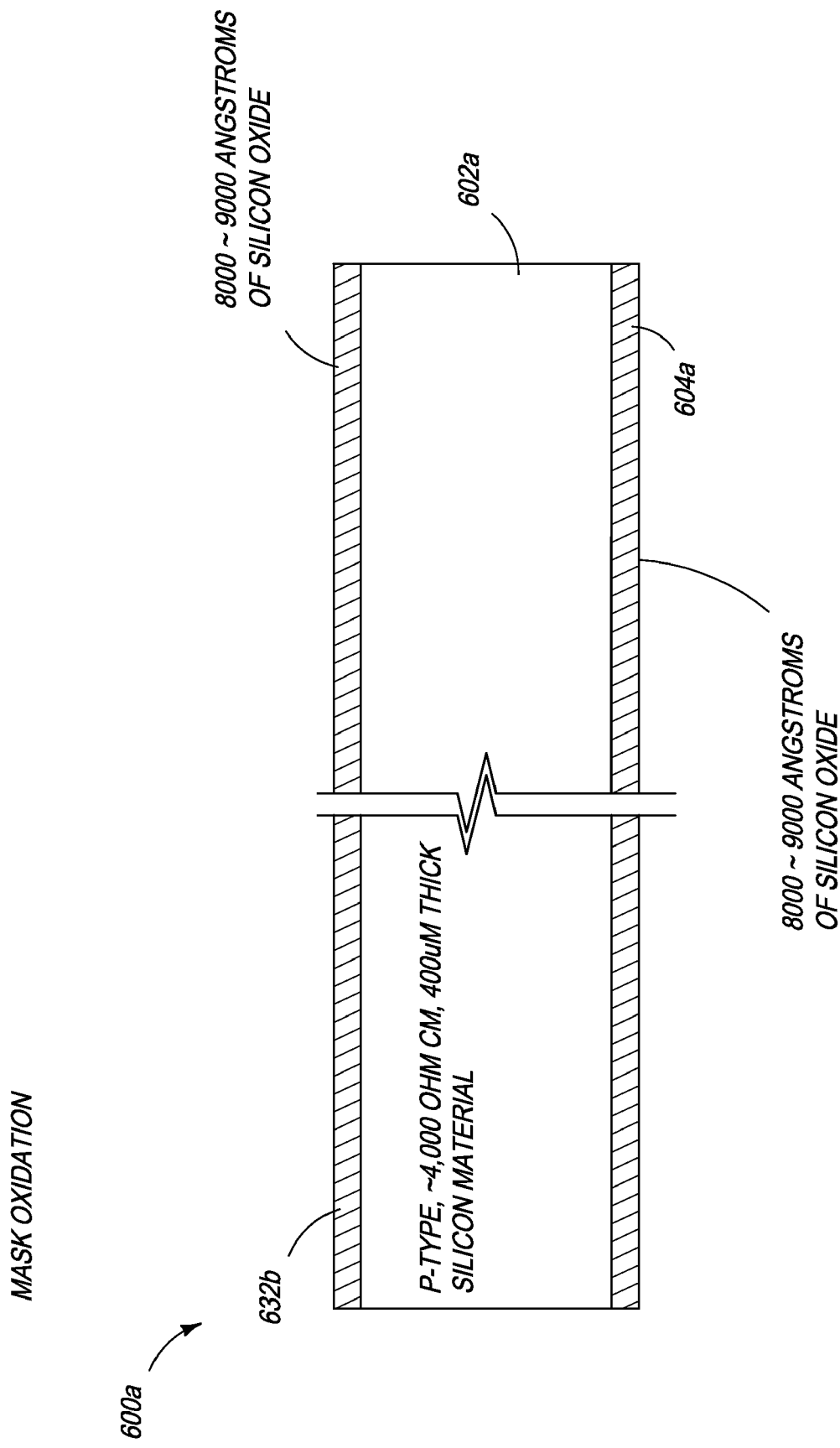
FIG. 6a shows the step of mask oxidation in a second embodiment of the wavelength sensitive photodiode device of the present invention.

FIG. 6a depicts the first step for manufacturing of sensor photodiode 600a of the present invention, where the starting material of the photodiode is substrate wafer 602a. In one embodiment the wafer 602a is P-type silicon having a resistivity of about 4,000 ohm-cm, and 400 μm thick. The device wafer 602a is polished on both sides to allow greater conformity to parameters, surface flatness, and specification thickness. However, it should be understood by those of ordinary skill in the art that the above specifications are not binding and that the material type and wafer size can be easily changed to suit the design, fabrication, and functional requirements of the present invention. The device wafer 602a is subjected to a standard mask oxidation process that grows silicon oxide layers 603a, 604a on front and back sides, respectively, of the device wafer. In one embodiment, the oxidation mask is made of silicon oxide (SiO2) or silicon nitride (Si3N4) and thermal oxidation is employed to achieve mask oxidation. In one embodiment, the oxide layers 603a, 604a have a thickness ranging from 8000 to approximately 9000 Angstroms.

Figure 6B:
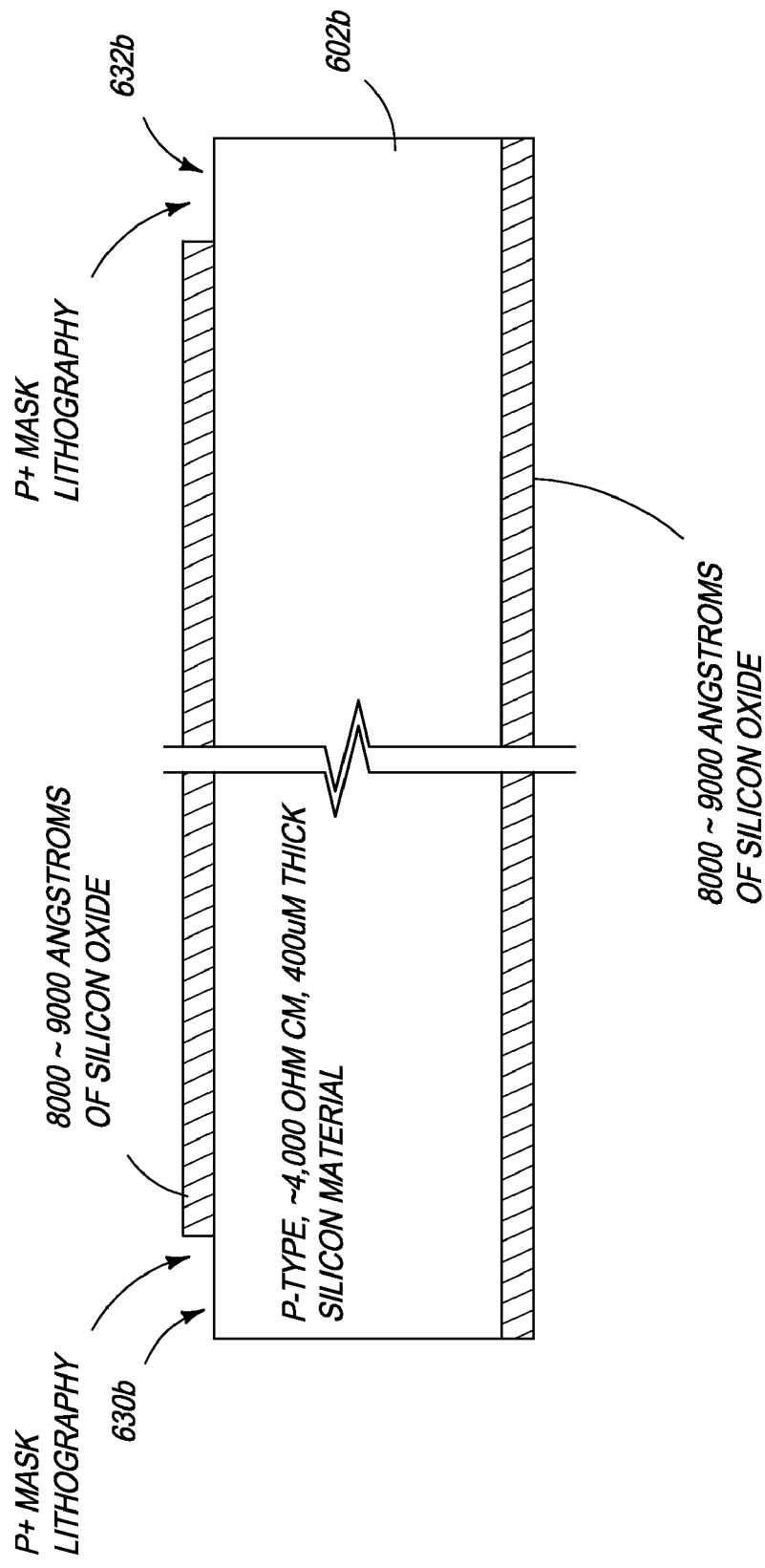
FIG. 6b shows the steps of P+ mask lithography and oxide etching on front side in a second embodiment of the wavelength sensitive photodiode device of the present invention.

As shown in FIG. 6b, after the standard mask oxidation is complete, during the next step the device wafer 602b is subjected to p+ photolithography on the front-side. Photolithography includes employing a photoresist layer to etch a specific pattern on the surface of the wafer. Generally, the photoresist layer is a photosensitive polymeric material for photolithography and photoengraving that can form a patterned coating on the surface. After selecting a suitable material and creating a suitable photoresist pattern, a thin photoresist layer is applied to the front side of the device wafer 602*b*. In one embodiment, the photoresist layer is applied via a spin coating technique. Spin coating is well-known to those of ordinary skill in the art and will not be described in detail herein. The photoresist layer is then appropriately treated to reveal p+ diffusion regions 630*b*, 632*b*.

In one embodiment of the present invention, the device wafer 602*b* is subjected to p+ masking. P+ masking is employed to protect portions of device wafer 602*b*. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the p+ mask comprises a plurality of diffusion windows with appropriate geometrical and dimensional specifications. The photoresist coated device wafer 602*b* is aligned with the p+ mask. An intense light, such as UV light, is projected through the mask, exposing the photoresist layer in the pattern of the p+ mask. The p+ mask allows selective irradiation of the photoresist on the device wafer. Regions that are exposed to radiation are hardened while those that are reserved for deep diffusion remain shielded by the p+ mask and easily removed. The exposed and remaining photoresist is then subjected to a suitable chemical or plasma etching to reveal the pattern transfer from the mask to the photoresist layer. An etching process is then employed to remove the silicon dioxide layer. In one embodiment, the pattern of the photoresist layer and/or p+ mask defines regions 630*b*, 632*b* devoid of the oxide layer 603*a* (deposited as shown in FIG. 6*a*) and is ready for p+ diffusion.

Figure 6C:
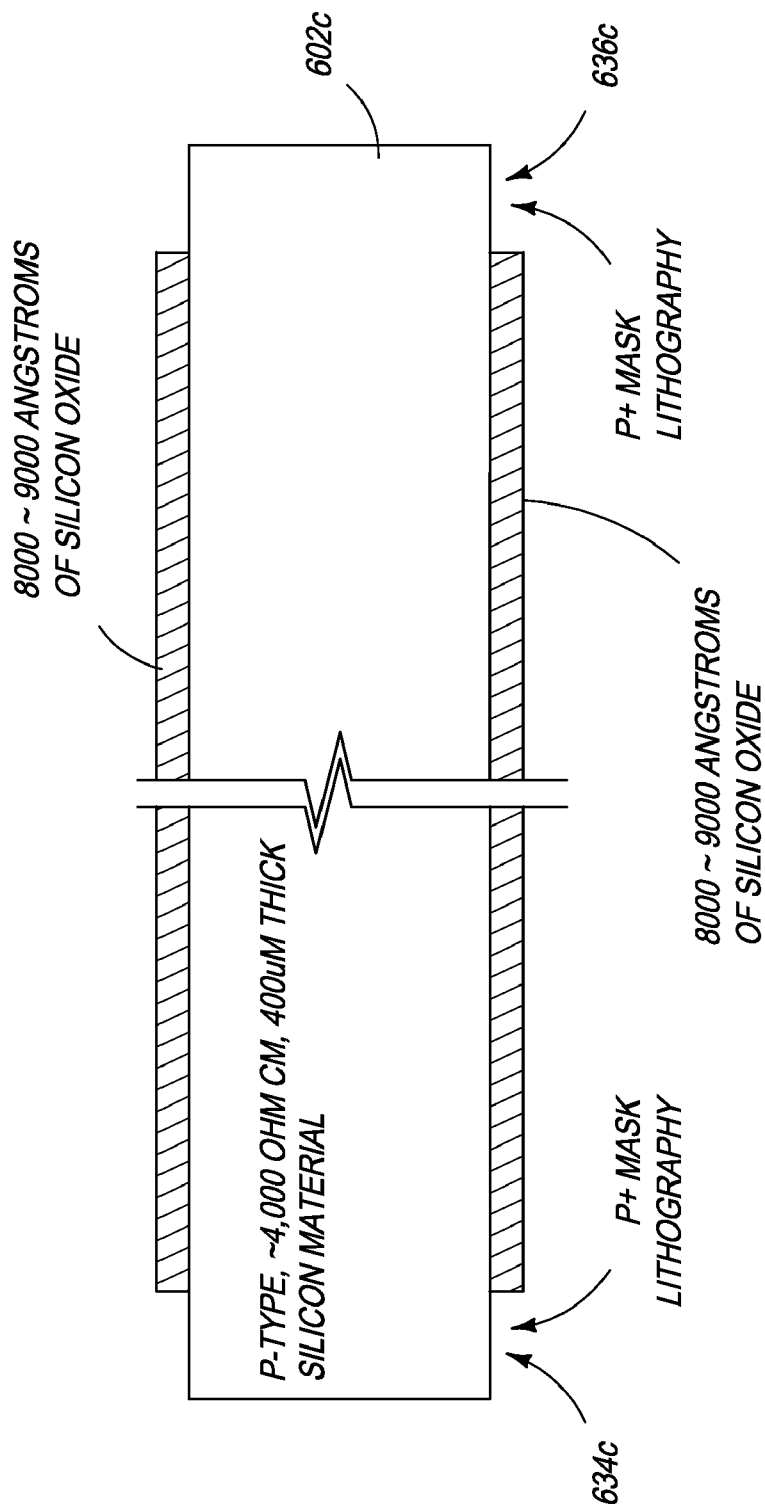
FIG. 6c shows the steps of P+ mask lithography and oxide etching on back side in another embodiment of the wavelength sensitive photodiode device of the present invention.

In the next step, shown in FIG. 6*c*, the device wafer 602*c* is subjected to p+ photolithography on the back-side. The procedure followed for p+ photolithography on the back side is the same as that followed for the front side, described above with reference to FIG. 6*b*. This step creates two more regions 634*c* and 636*c*, devoid of the oxide layer and ready for p+ diffusion.

Figure 6D:
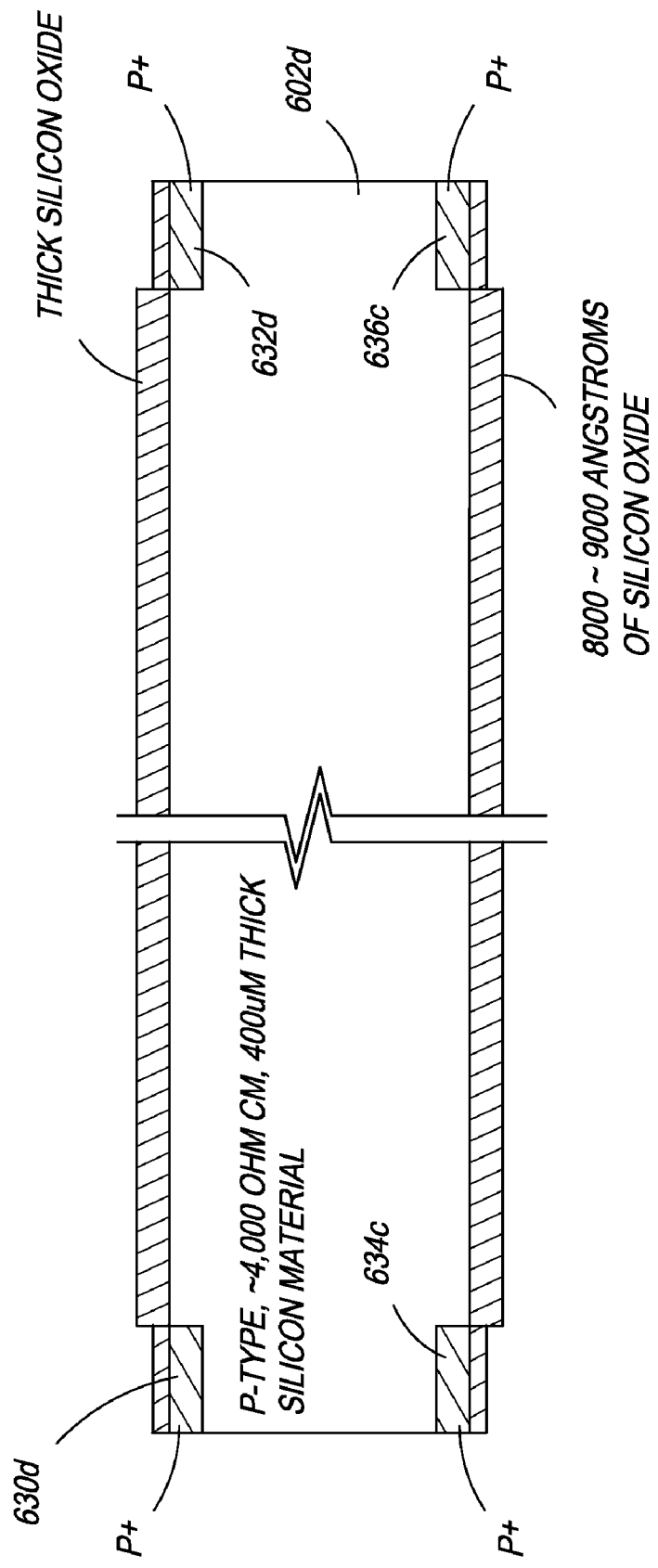
FIG. 6d shows the steps of P+ deposition followed by drive-in oxidation on the front side in a second embodiment of the wavelength sensitive photodiode device of the present invention.

Now referring to FIG. 6*d*, in the next step the device wafer 602*c* is subjected to P+ deposition in regions on the front side 630*d*, 632*d* as well as on the back side 634*d* and 636*d*. This is followed by drive-in oxidation. This P+ diffusion enables necessary ohmic contacts. An appropriate amount of dopant atoms is deposited onto the substrate wafer 602*d* and fills the gaps left by the removed photoresist layer. In one embodiment, the dopant atoms deposited may include boron dopant atoms. Thereafter, the wafer 602*d* is subjected to a boron drive-in oxidation process that is used to redistribute the dopant atoms and deposit them deeper into the wafer. In addition, exposed silicon surfaces are oxidized.

Figure 6E:
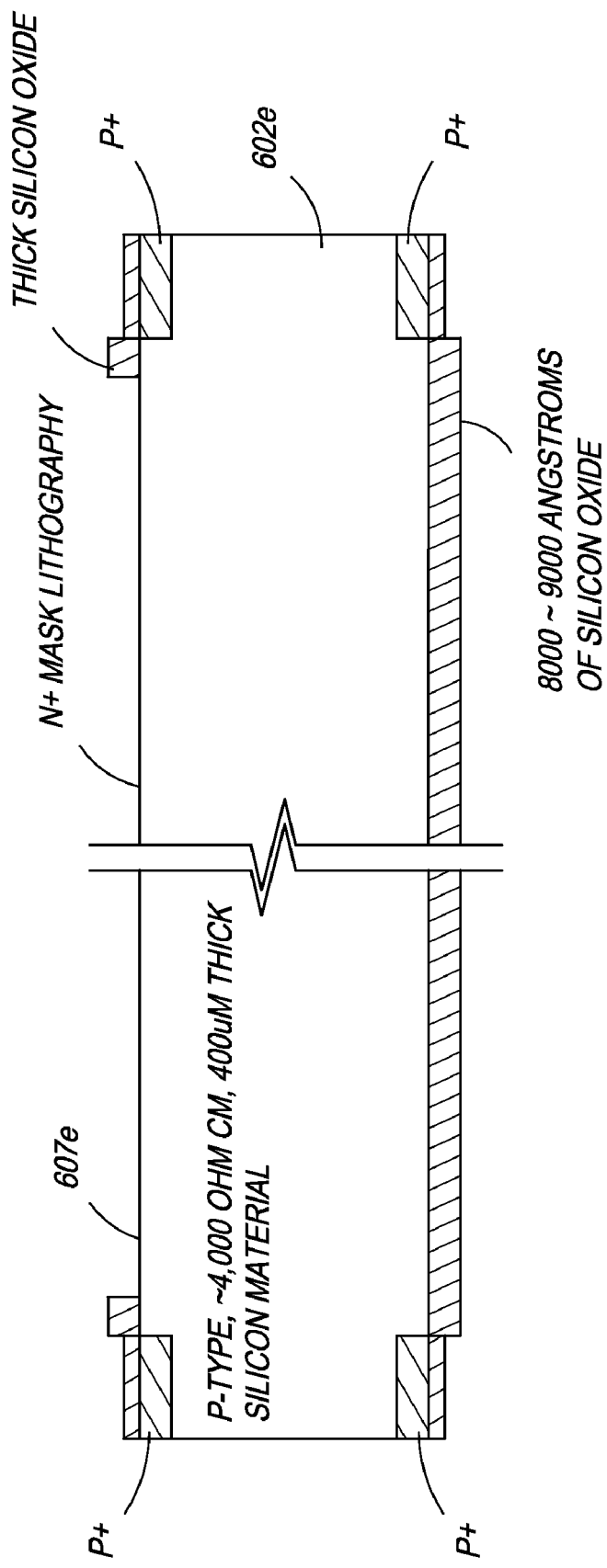
FIG. 6e shows the steps of n+ mask lithography on front side followed by oxide etching on front side in a second embodiment of the wavelength sensitive photodiode device of the present invention.
Figure 6F:
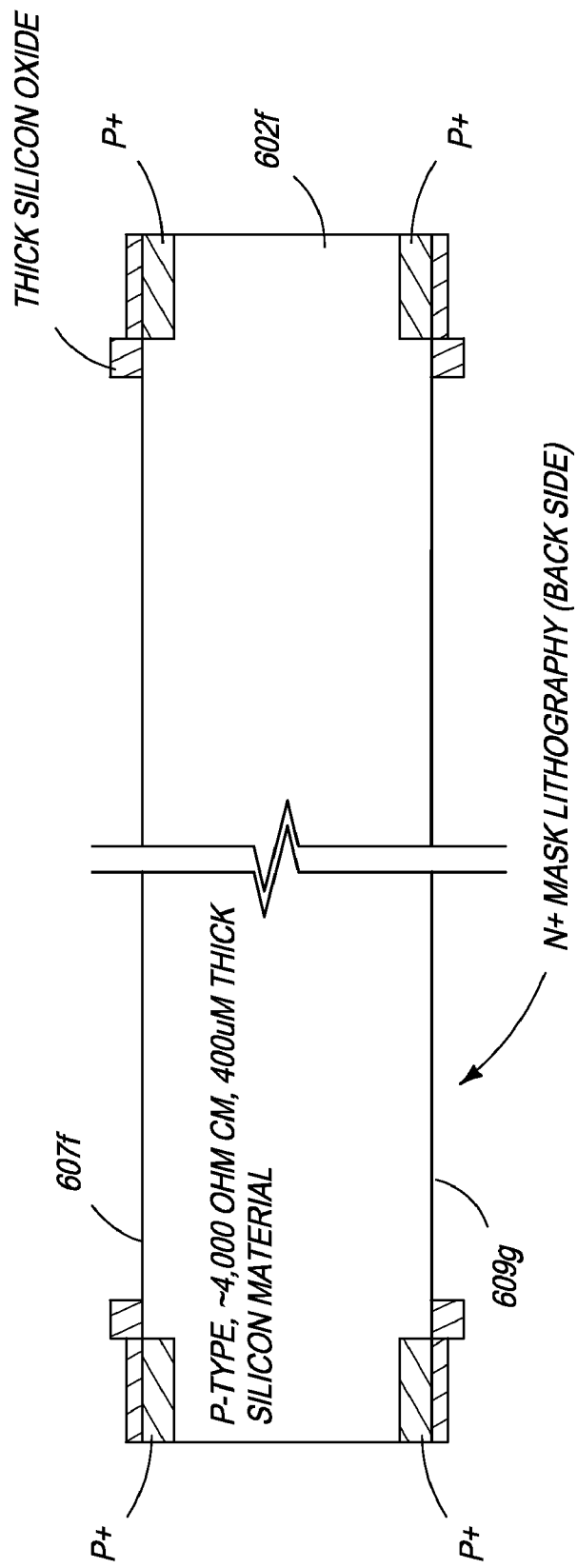
FIG. 6f shows the steps of n+ mask lithography on back side followed by oxide etching on back side in a second embodiment of the wavelength sensitive photodiode device of the present invention.

Referring now to FIGS. 6*e* and 6*f*, during subsequent steps of fabrication, the front and back sides of the device wafer 602*e*, 602*f* undergo n+ photolithography process to create regions 607*e*, 609*f* along with oxide etching on front and back sides, respectively. As with any conventional photolithography process, n+ photolithography comprises of the following tasks: substrate preparation; photoresist application; soft baking; mask alignment; exposure development, hard baking, and etching. In addition various other chemical treatments may be performed. In one embodiment, the pattern of the photoresist layer and/or n+ mask defines regions 607*e*, 609*f* on the front and back sides respectively. Both regions 607*e*, 609*f* are devoid of oxide layers 603*a*, 604*a* shown in FIG. 6*a*, and ready for n+ diffusion.

Figure 6G:
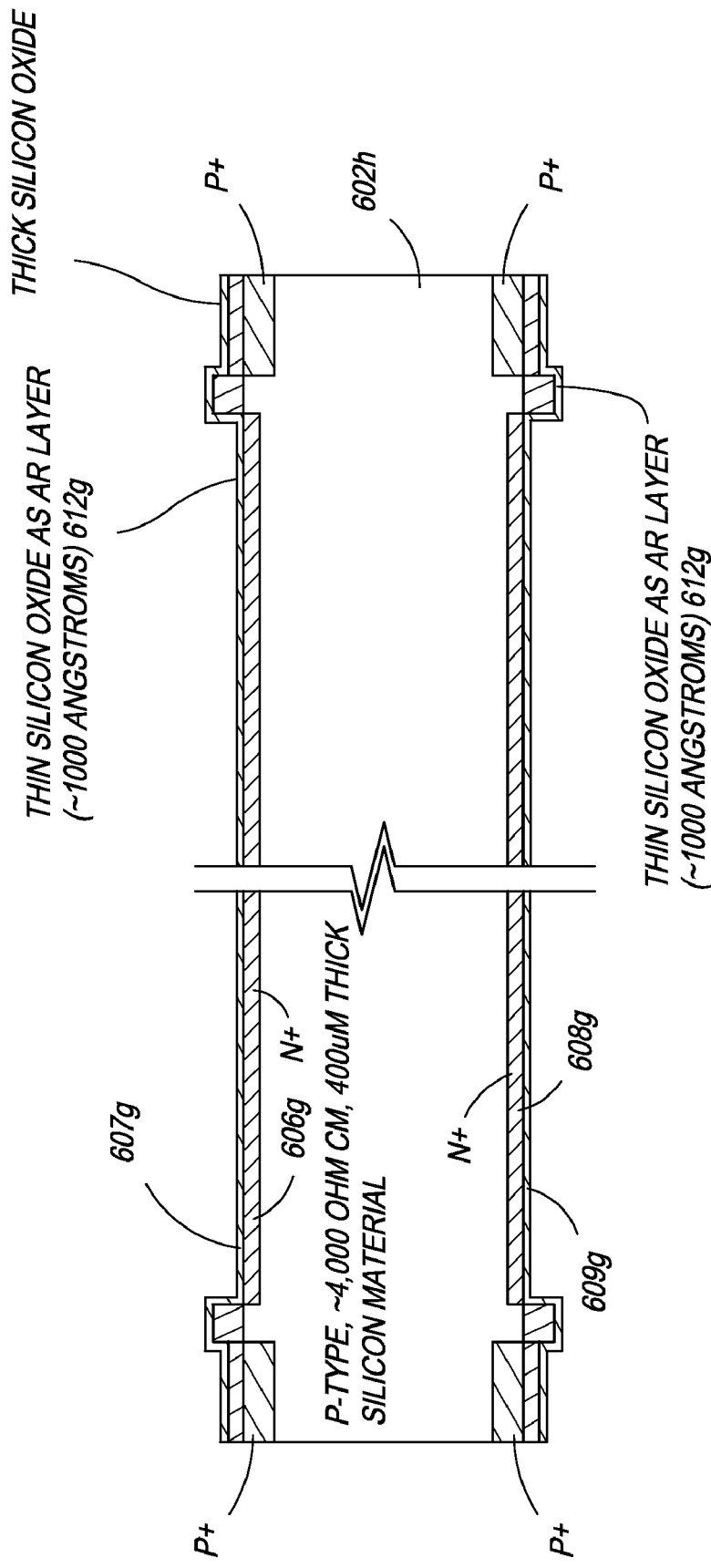
FIG. 6g shows the steps of n+ diffusion and drive-in oxidation on front and back sides in a second embodiment of the wavelength sensitive photodiode device of the present invention.

As shown in FIG. 6*g*, during the next step of fabrication, regions 607*g*, 609*g* are subjected to n+ diffusion and drive-in oxidation to develop n+ diffusion layers 606*g*, 608*fg* on front and back sides respectively. The diffusion and drive-in oxidation allows predefined and/or predetermined thermal budget in accordance with the principles of the present invention. In one embodiment of the present invention the n+ dopant is phosphorous. In addition, exposed n+ diffused regions 607*g*, 609*g* are oxidized with thin anti-reflective layers 612*g* that in one embodiment are of silicon oxide and about 1000 Angstrom thick.

Figure 6H:
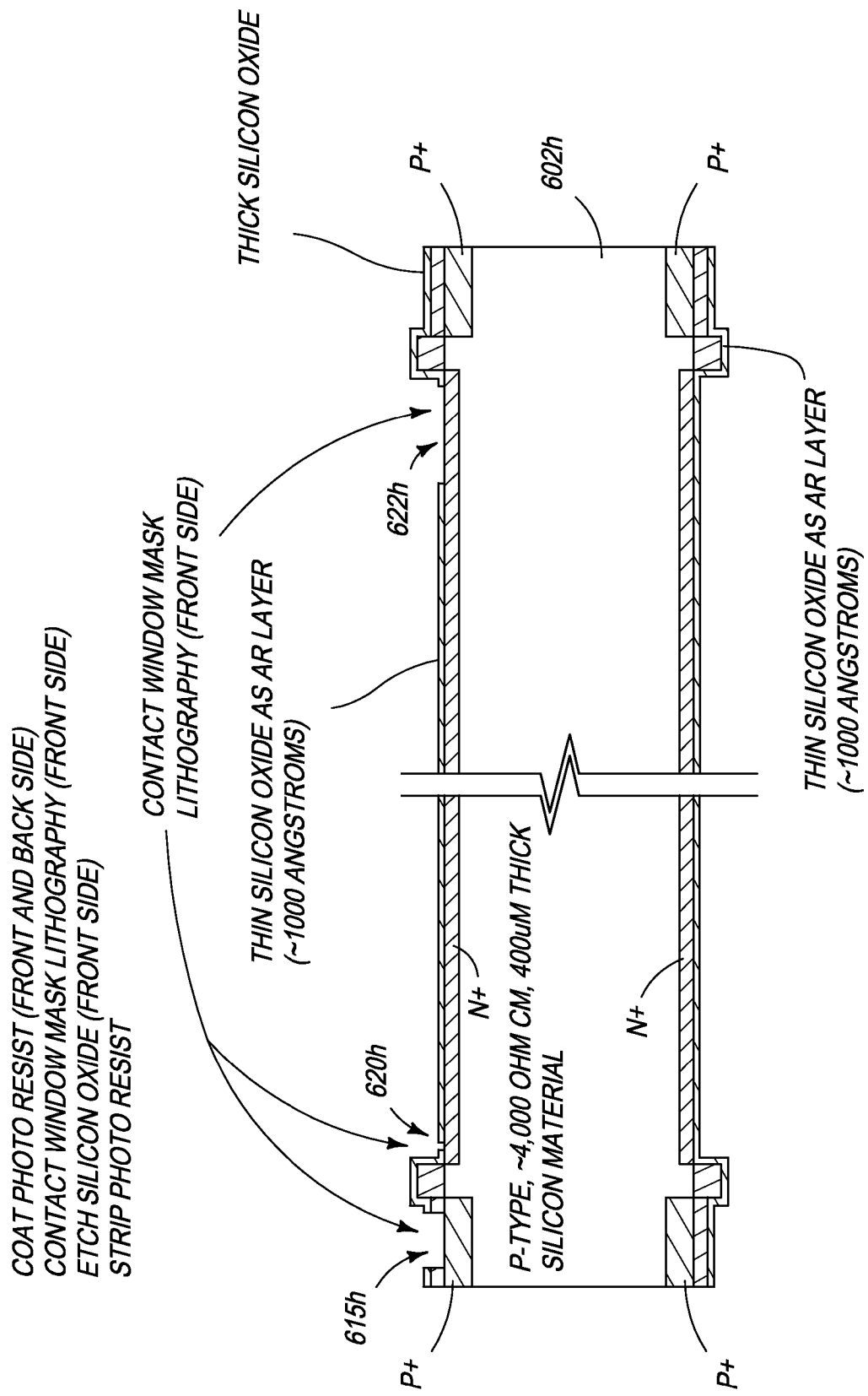
FIG. 6h shows the steps of contact window mask lithography on front side followed by oxide layer etching on front side in a second embodiment of the wavelength sensitive photodiode device of the present invention.

In the next step shown in FIG. 6*h*, a photo resist layer is applied on the front and back sides of the device wafer 602*h* and a contact window mask is etched on the front-side of the device wafer. The contact mask is formed on the front-side of the device wafer 602*h* by using standard semiconductor technology photolithography techniques. As with any conventional photolithography process, contact window mask lithography comprises of the following tasks: substrate preparation; photoresist application; soft baking; mask alignment; exposure development, hard baking, and etching. In one embodiment, contact windows 615*h*, 620*h*, 622*h* are formed by removing the anti-reflective layer using either standard wet or standard dry etching techniques on the front-side of the device wafer.

Figure 6I:
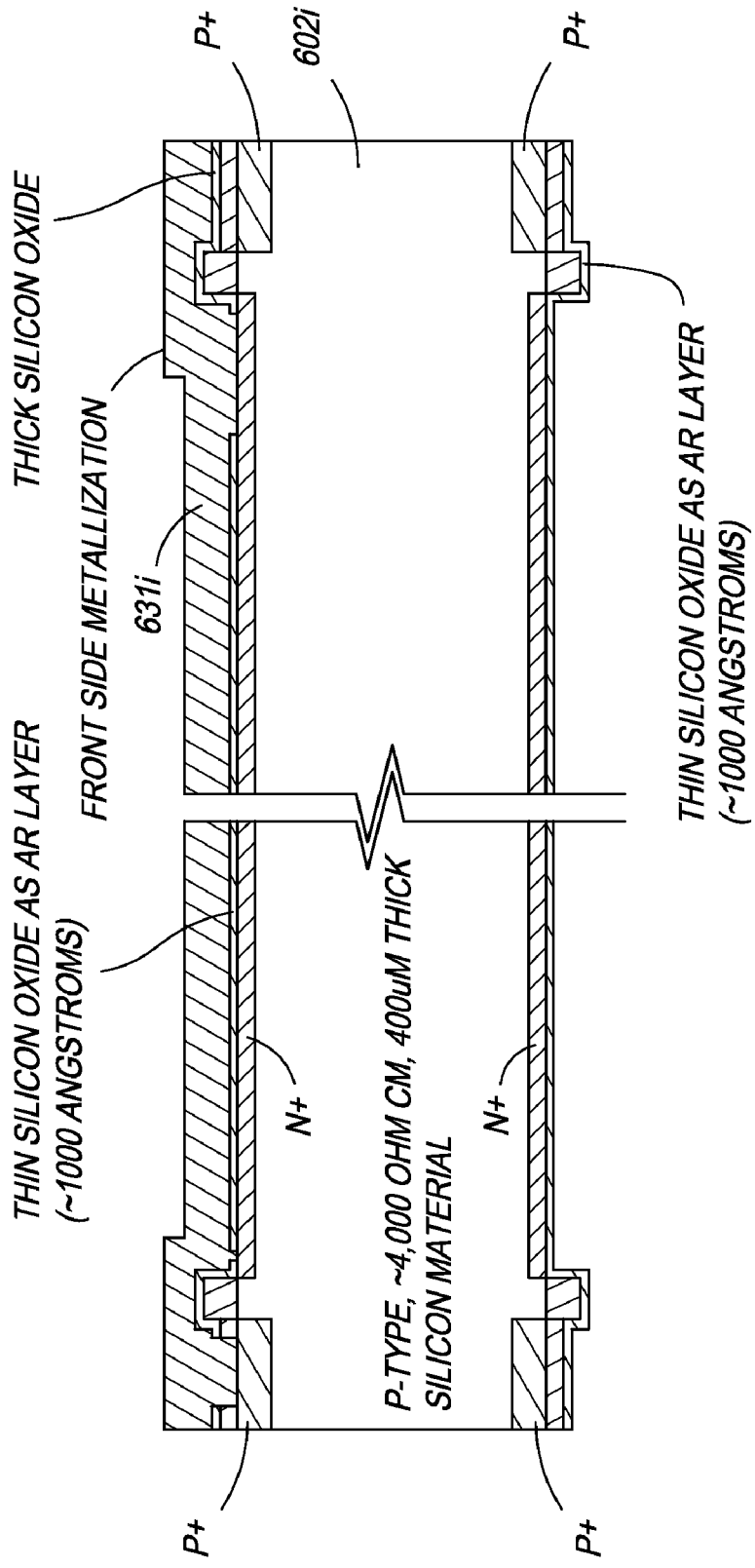
FIG. 6i shows the step of depositing metal on front side in a second embodiment of the wavelength sensitive photodiode device of the present invention.

In the next step, as shown in FIG. 6*i*, metal deposition is carried out on front side of the device wafer 602*i*. In the metal deposition process, also known as metallization, metal layers 631*i* are deposited on the wafer to create conductive pathways. The most common metals include aluminum, nickel, chromium, gold, germanium, copper, silver, titanium, tungsten, platinum and tantalum.

Figure 6J:
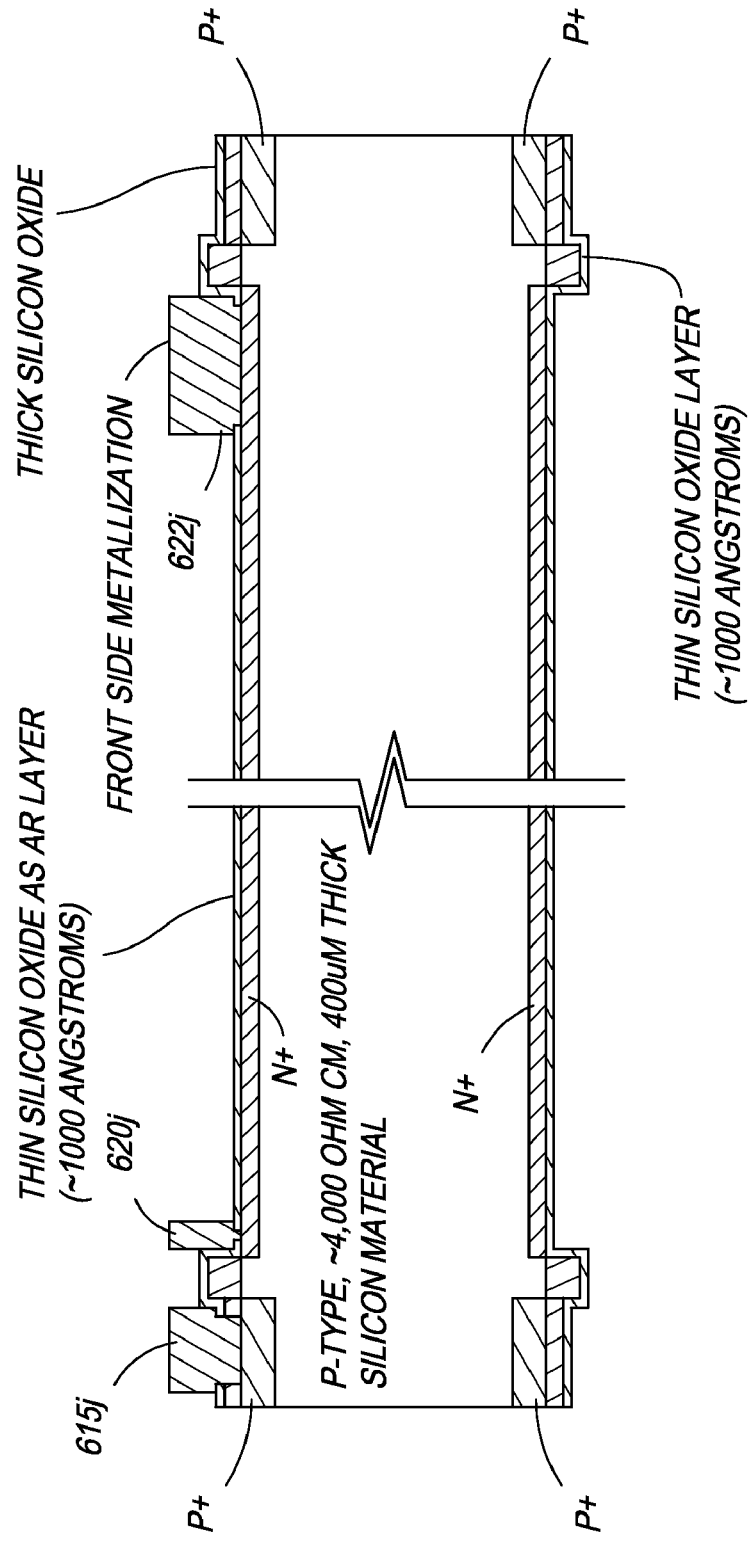
FIG. 6j shows the steps of metal mask lithography on front side followed by metal etching in a second embodiment of the wavelength sensitive photodiode device of the present invention.

Referring to FIG. 6*j*, during the next step, the front-side of the device wafer 602*j* undergoes a process of metal lithography thereby forming front-side metal contacts 615*j*, 620*j*, 622*j*. These metal contacts provide the necessary interface between the various devices and the photodiodes/photodiode arrays and for creating electrical connections to n+ and p+ diffused regions. In one embodiment of the present invention the front-side of the device wafer 602*j* is metal etched. Metal etching can be performed in a variety of methods including but not limited to abrasive etching, dry etching, electro etching, laser etching, photo etching, reactive ion etching, sputter etching, and vapor phase etching.

Figure 6K:
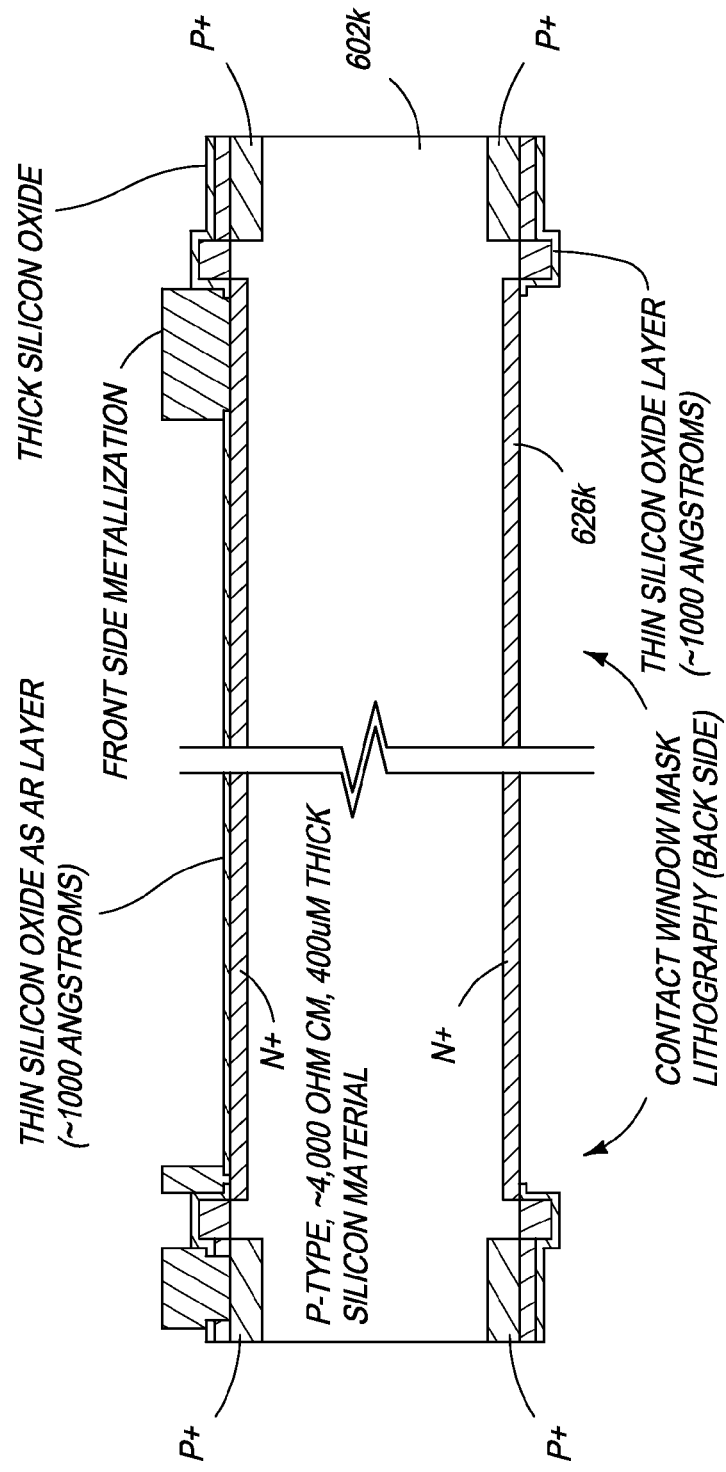
FIG. 6k shows the steps of contact window mask lithography on back side followed by etching oxide layer on back side in a second embodiment of the wavelength sensitive photodiode device of the present invention.

Referring now to FIG. 6*k*, at the next step a contact window mask is etched on the back-side of the device wafer 602*k*. The contact mask is formed on the front-side of the device wafer 602*k* by using standard semiconductor technology photolithography techniques comprising of the following tasks: substrate preparation; photoresist application; soft baking; mask alignment; exposure development, hard baking, and etching. In one embodiment, contact window 626*k* is formed by removing the anti-reflective layer using either standard wet or standard dry etching techniques on the back-side of the device wafer.

Figure 6L:
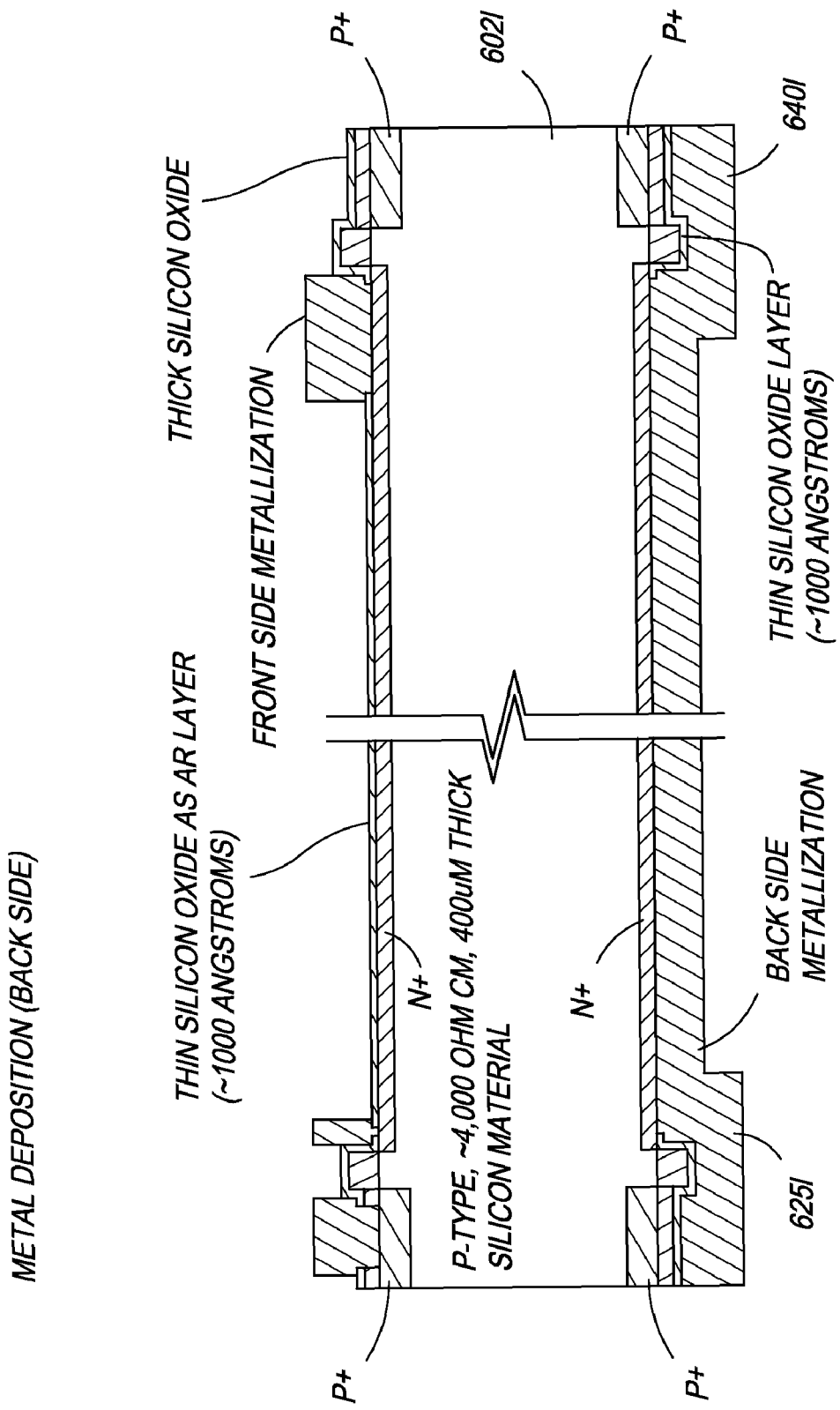
FIG. 6l shows the step of depositing metal on back side in a second embodiment of the wavelength sensitive photodiode device of the present invention.
Figure 6M:
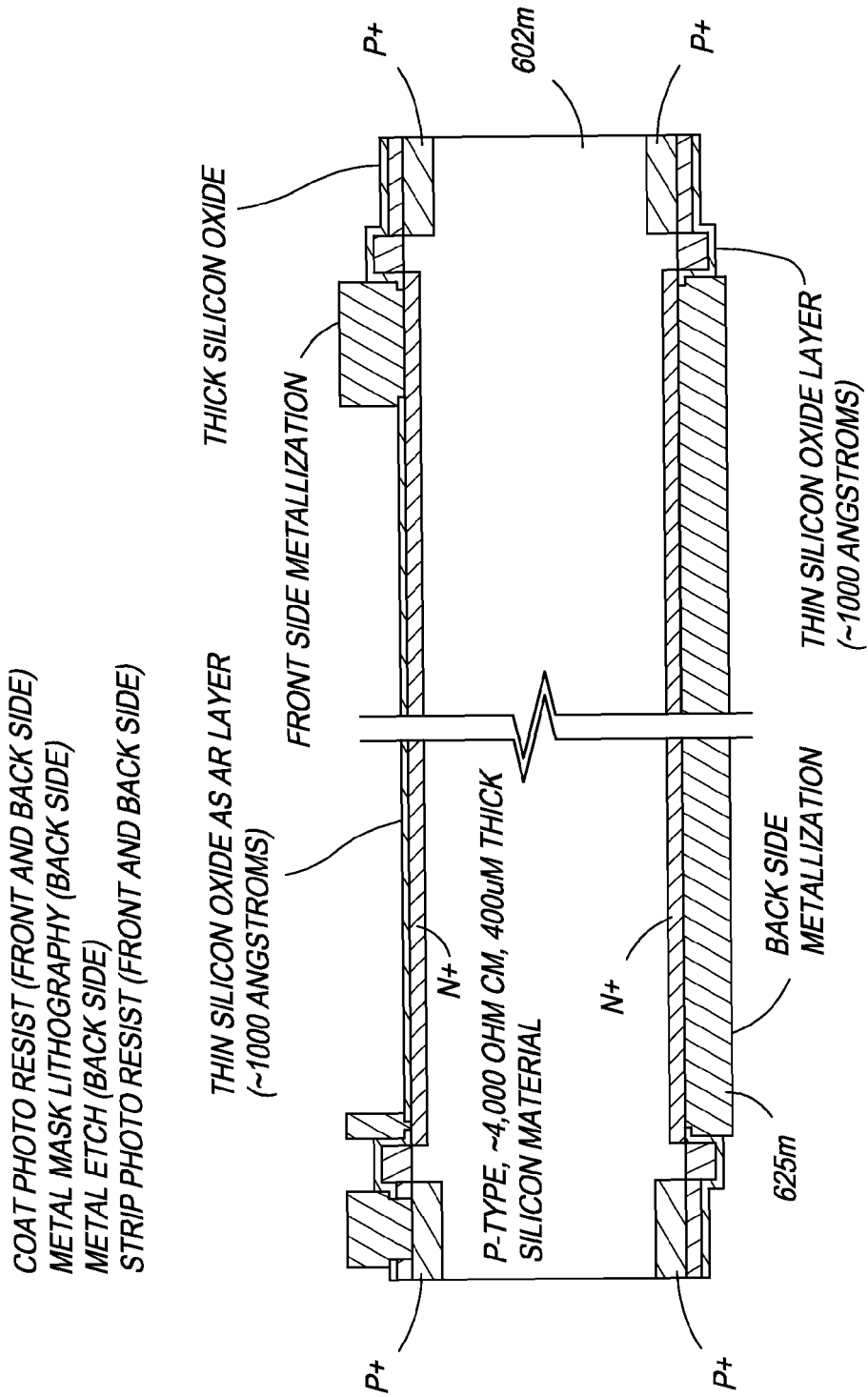
FIG. 6m shows the step of metal mask lithography on back side followed by metal etching in a second embodiment of the wavelength sensitive photodiode device of the present invention.

During the next step, as shown in FIG. 6*l*, a layer of metal 640*l* is deposited on the back side of the device wafer 602*l*. In the next step shown in FIG. 6*m*, the back-side of the device wafer 602*m* undergoes metal lithography thereby forming back-side metal contact 625*m*. In one embodiment of the present invention the back-side of the device wafer 602*m* is metal etched.

Figure 7:
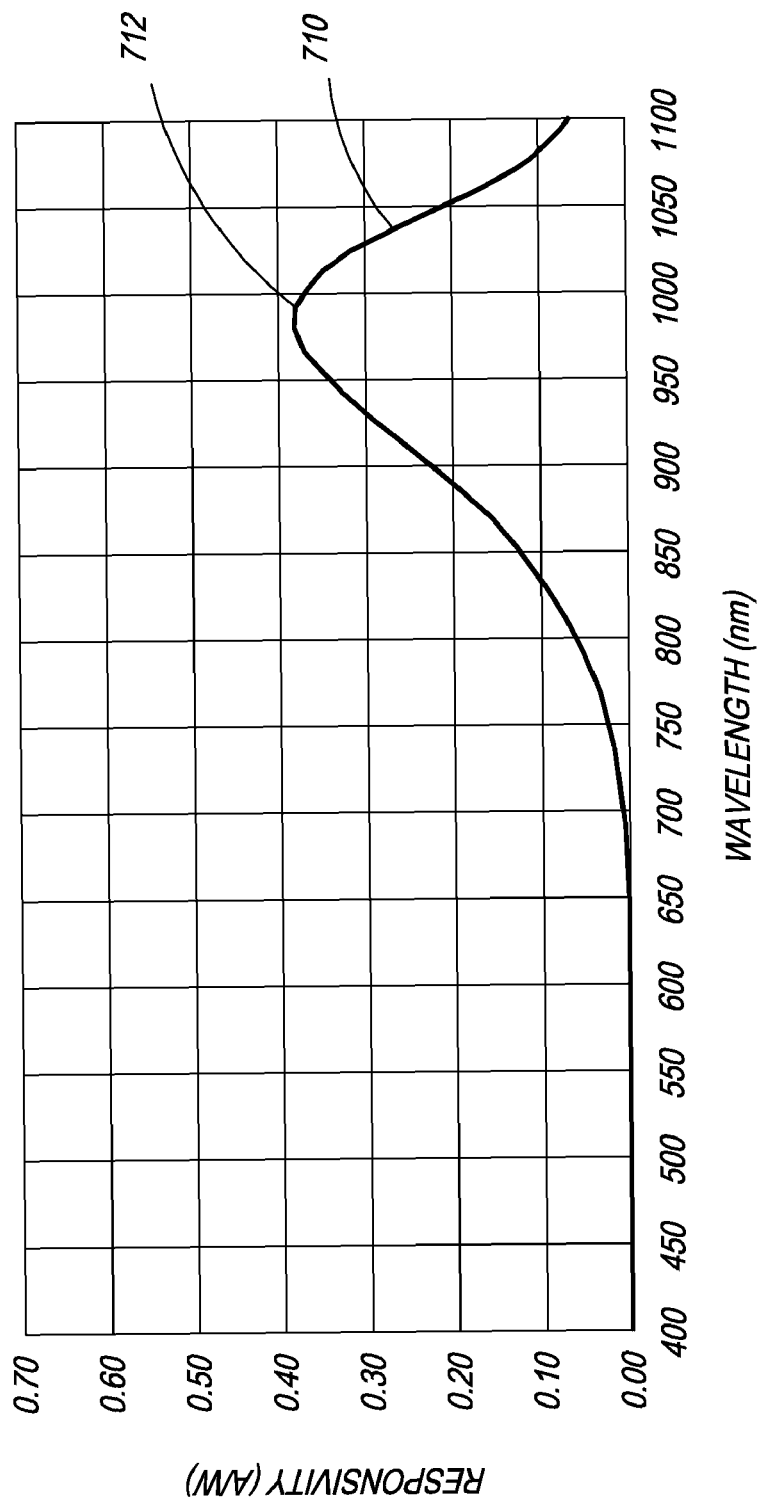
FIG. 7 shows an exemplary spectral sensitivity curve when the wavelength sensitive photodiode device of the present invention is used as a high pass filter.

FIG. 7 shows an exemplary spectral sensitivity curve when the wavelength sensitive photodiode device of the present invention is used as a high pass filter only. Referring to FIG. 7, curve 710 corresponds to a spectral response when front PN Junction of the photodiode is shorted, while the back PN Junction is at 20V reverse bias. As can be seen in the figure, curve 710 achieves its peak 712 between wavelengths of 950 and 1000 nm, which clearly indicates a high pass response.

One of ordinary skill in the art would appreciate that the wavelength sensitive photodiode device of the present invention may also be used as a low pass filter only, by shorting the back PN Junction and placing the front PN junction at a bias voltage of appropriate level.

While the exemplary embodiments of the present invention are described and illustrated herein, it will be appreciated that they are merely illustrative. It will be understood by those skilled in the art that various changes in form and detail may be made therein without departing from or offending the spirit and scope of the invention.

We claim:

1. A dual junction photodiode semiconductor device comprising:
   a. a semiconductor substrate of a first conductivity type;
   b. a first impurity region of a second conductivity type shallowly diffused on a first side of said semiconductor substrate, wherein said first impurity region has a thickness and resistivity adapted to filter wavelengths in a range of 200 nm to 800 nm;
   c. a second impurity region of the second conductivity type shallowly diffused on a second side of said semiconductor substrate, said second side being opposite to said first side, wherein said second impurity region has a thickness and resistivity adapted to filter wavelengths in a range of 800 nm to 1100 nm;
   d. a first PN junction formed between said semiconductor substrate and first impurity region; and
   e. a second PN junction formed between said semiconductor substrate and said second impurity region.

2. The dual junction photodiode semiconductor device of claim 1, wherein said first and second PN junctions are formed at a first depth and a second depth from a top surface of said semiconductor substrate, wherein the second depth is deeper than the first depth.

3. The dual junction photodiode semiconductor device of claim 1, wherein said semiconductor substrate has a resistivity in a range of 4000 ohm-cm and a thickness of in a range of 400 microns.

4. The dual junction photodiode semiconductor device of claim 1, further comprising:
   a. a first output electrode connected to said first impurity region;
   b. a second output electrode connected to said second impurity region; and
   c. a third output electrode connected to said semiconductor substrate, wherein said first and third output electrodes are output electrodes of the first PN junction, and said second and third output electrodes are output electrodes of the second PN junction.

5. The dual junction photodiode semiconductor device of claim 1, wherein said first conductivity type is p+.

6. The dual junction photodiode semiconductor device of claim 5, wherein said second conductivity type is n+.

7. The dual junction photodiode semiconductor device of claim 1, wherein said first conductivity type is n+.

8. The dual junction photodiode semiconductor device of claim 7, wherein said second conductivity type is p+.

9. The dual junction photodiode semiconductor device of claim 1, further comprising an anti-reflective layer on said first side.

10. The dual junction photodiode semiconductor device of claim 9, wherein the anti-reflective layer is about 1000 Angstroms thick.

11. A multi-junction photodiode semiconductor device comprising:
   a. a semiconductor substrate of a first conductivity type;
   b. a low pass filter wherein said low pass filter comprises a first impurity region of a second conductivity type shallowly diffused on a first side of said semiconductor substrate, wherein an interface between said first impurity region and said first side of the semiconductor substrate forms a first PN junction and wherein said low pass filter has a thickness and resistivity adapted to be responsive to wavelengths in a range of 200 nm to 800 nm; and
   c. a high pass filter wherein said high pass filter comprises a second impurity region of the second conductivity type shallowly diffused on a second side of said semiconductor substrate, said second side being opposite to said first side, wherein an interface between said second impurity region and said second side of the semiconductor substrate forms a second PN junction and wherein said high pass filter has a thickness and resistivity adapted to filter wavelengths in a range of 800 nm to 1100 nm.

12. The multi-junction photodiode semiconductor device of claim 11, wherein said first and second PN junctions are formed at a first depth and a second depth from a top surface of said semiconductor substrate, wherein the second depth is deeper than the first depth.

13. The multi-junction photodiode semiconductor device of claim 11, wherein said semiconductor substrate has a resistivity in a range of 4000 ohm-cm and a thickness of in a range of 400 microns.

14. The multi-junction photodiode semiconductor device of claim 11, further comprising:
   a. a first output electrode connected to said first impurity region;
   b. a second output electrode connected to said second impurity region; and
   c. a third output electrode connected to said semiconductor substrate, wherein said first and third output electrodes are output electrodes of the first PN junction, and said second and third output electrodes are output electrodes of the second PN junction.

15. The multi-junction photodiode semiconductor device of claim 11, wherein said first conductivity type is p+.

16. The multi-junction photodiode semiconductor device of claim 15, wherein said second conductivity type is n+.

17. The multi-junction photodiode semiconductor device of claim 11, wherein said first conductivity type is n+.

18. The multi-junction photodiode semiconductor device of claim 17, wherein said second conductivity type is p+.

19. The multi-junction photodiode semiconductor device of claim 11, further comprising an anti-reflective layer on said first side.

20. The multi-junction photodiode semiconductor device of claim 19, wherein the anti-reflective layer is about 1000 Angstroms thick.

* * * * *